(12) United States Patent
Park et al.

(10) Patent No.: US 11,404,538 B2
(45) Date of Patent: Aug. 2, 2022

(54) SEMICONDUCTOR MEMORY DEVICE AND METHOD OF FABRICATING SAME

(71) Applicant: SAMSUNG ELECTRONICS CO., LTD., Suwon-si (KR)

(72) Inventors: Taejin Park, Gyeonggi-do (KR); Chulkwon Park, Hwaseong-si (KR); Soyeong Kim, Suwon-si (KR); Eun A Kim, Seoul (KR); Hyo-Sub Kim, Seoul (KR); Sohyun Park, Seoul (KR); Sunghee Han, Hwaseong-si (KR); Yoosang Hwang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 16/996,282

(22) Filed: Aug. 18, 2020

(65) Prior Publication Data
US 2021/0273048 A1 Sep. 2, 2021

(30) Foreign Application Priority Data
Feb. 27, 2020 (KR) .......................... 10-2020-0024309

(51) Int. Cl.
*H01L 29/06* (2006.01)
*H01L 29/41* (2006.01)
*H01L 21/28* (2006.01)
*H01L 21/762* (2006.01)

(52) U.S. Cl.
CPC .... *H01L 29/0649* (2013.01); *H01L 21/76224* (2013.01); *H01L 29/4011* (2019.08); *H01L 29/41* (2013.01)

(58) Field of Classification Search
CPC . H01L 29/0649; H01L 29/4011; H01L 29/41; H01L 21/76224; H01L 21/7624; H01L 27/10855; H01L 27/10814; H01L 27/10847
USPC ....................................................... 257/263
See application file for complete search history.

(56) References Cited

U.S. PATENT DOCUMENTS

| 8,906,763 | B2 | 12/2014 | Park et al. | |
|---|---|---|---|---|
| 9,786,598 | B2 | 10/2017 | Kim et al. | |
| 9,837,490 | B2 | 12/2017 | Park et al. | |
| 10,068,907 | B1* | 9/2018 | Tsai | H01L 27/10855 |
| 10,074,656 | B1* | 9/2018 | Wang | H01L 27/10885 |
| 10,170,362 | B2 | 1/2019 | Chang et al. | |
| 10,211,210 | B2* | 2/2019 | Ma | H01L 27/10811 |
| 10,381,306 | B2 | 8/2019 | Chang et al. | |

(Continued)

FOREIGN PATENT DOCUMENTS

| KR | 10-0363710 B1 | 11/2002 |
|---|---|---|
| KR | 10-2014-0078473 A | 6/2014 |

*Primary Examiner* — Dao H Nguyen
(74) *Attorney, Agent, or Firm* — Volentine, Whitt & Francos, PLLC

(57) ABSTRACT

A semiconductor memory device includes; a first impurity region and a second impurity region spaced apart in a substrate, a device isolation pattern between the first impurity region and the second impurity region, a bit-line contact on the first impurity region, a storage node contact on the second impurity region and a dielectric pattern between the bit-line contact and the storage node contact. An upper part of a sidewall of the device isolation pattern has a first slope and a lower part of the sidewall of the device isolation pattern has a second slope different from the first slope.

19 Claims, 29 Drawing Sheets

(56) References Cited

U.S. PATENT DOCUMENTS

| | | | |
|---|---|---|---|
| 11,121,135 B1* | 9/2021 | Ikeda | H01L 27/10885 |
| 2002/0024093 A1 | 2/2002 | Ahn et al. | |
| 2016/0181143 A1* | 6/2016 | Kwon | H01L 21/7682 |
| | | | 438/586 |
| 2018/0175040 A1* | 6/2018 | Kim | H01L 27/10823 |

\* cited by examiner

SEMICONDUCTOR MEMORY DEVICE AND METHOD OF FABRICATING SAME

CROSS-REFERENCE TO RELATED APPLICATION

This U.S. nonprovisional application claims priority under 35 U.S.C. § 119 to Korean Patent Application No. 10-2020-0024309 filed on Feb. 27, 2020 in the Korean Intellectual Property Office, the subject matter of which is hereby incorporated by reference.

BACKGROUND

The inventive concept relates generally to semiconductor memory devices and methods of fabricating same.

Semiconductor devices are an important factor in the electronic industry because of their small size, advanced capabilities and low fabrication cost. Semiconductor devices are ever more densely integrated to meet evolving demands for increased functionality and smaller physical size. As a result, line widths for various patterns in contemporary semiconductor devices are being reduced. However, new and expensive exposure techniques are required to achieve the desired fineness of certain patterns, and this trend makes the fabrication of densely integrated semiconductor devices more difficult. Various studies have recently been conducted into new integration techniques.

SUMMARY

Some embodiments of the inventive concept provide semiconductor memory devices with increased reliability. Some embodiments of the inventive concept provide methods of fabricating a semiconductor memory device that provide increased reliability by reducing process defects.

According to embodiments of the inventive concept, a semiconductor memory device may include; a first impurity region and a second impurity region spaced apart in a substrate, a device isolation pattern between the first impurity region and the second impurity region, a bit-line contact on the first impurity region, a storage node contact on the second impurity region, and a dielectric pattern between the bit-line contact and the storage node contact, wherein an upper part of a sidewall of the device isolation pattern has a first slope, a lower part of the sidewall of the device isolation pattern has a second slope different from the first slope.

According to embodiments of the inventive concept, a semiconductor memory device may include; a substrate including a first impurity region spaced apart from a second impurity region, a device isolation pattern disposed between the first impurity region and the second impurity region, a bit-line contact on the first impurity region, a storage node contact on the second impurity region, and a dielectric pattern disposed between the bit-line contact and the storage node contact, wherein the dielectric pattern includes lower parts, each having a constant width, and upper parts, each having a variable width.

According to embodiments of the inventive concept, a semiconductor memory device may include; a first impurity region in a substrate, a pair of second impurity regions in the substrate, spaced apart from each other, and across from the first impurity region, device isolation patterns respectively between the first impurity region and the second impurity regions, a bit-line contact on the first impurity region, storage node contacts respectively on the second impurity regions, and dielectric patterns respectively between the bit-line contact and the storage node contacts, wherein sidewalls and upper surfaces of the device isolation patterns define a recess having a first inner sidewall and an opposing second inner sidewall, the first inner sidewall includes an upper part, a lower part and a first inflection point disposed above an upper surface of the first impurity region at which a slope of the first inner sidewall changes, and the second inner sidewall includes an upper part, a lower part and a second inflection point disposed above an upper surface of the first impurity region at which a slope of the second inner sidewall changes.

According to embodiments of the inventive concept, a method of fabricating a semiconductor memory device may include; forming a device isolation pattern in a substrate to define an active section, forming a first impurity region in the active section, forming a second impurity region in the active section spaced apart from the first impurity region, forming a buffer layer on the substrate, etching the buffer layer to expose an upper surface of the first impurity region, selectively etching the exposed first impurity region, isotropically etching the buffer layer and the device isolation pattern, forming a bit-line contact on the first impurity region, and forming a storage node contact on the second impurity region.

According to embodiments of the inventive concept, a method of fabricating a semiconductor memory device may include; anisotropically etching a buffer layer to form a buffer pattern including a recess that exposes a first impurity region in a substrate, wherein the first recess is displaced away from the first impurity region, selectively etching the first impurity region exposed by the buffer pattern, such that a depth of the recess is increased, isotropically etching exposed sidewalls of the buffer pattern and sidewalls of the device isolation pattern to expand the recess, conformally forming a line-shaped oxide layer over the recess to cover the first impurity region and the second impurity region, etching the oxide layer to form an oxide spacer that exposes the upper surface of the first impurity region and a lower surface of the recess, such that a lower part of a first inner sidewall of the recess and a lower part of a second inner sidewall of the recess are spaced apart by a same interval from the first impurity region.

DETAILED DESCRIPTION

Embodiments of the inventive concept will now be described in some additional detail with reference to the accompanying drawings.

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: end/central; inner/outer; height/width; vertical/horizontal; upper/lower; higher/lower; closer/farther; thicker/thinner; proximate/distant; above/below; under/over; upper/lower; center/side; surrounding; overlay/underlay; etc.

Figure 1A:
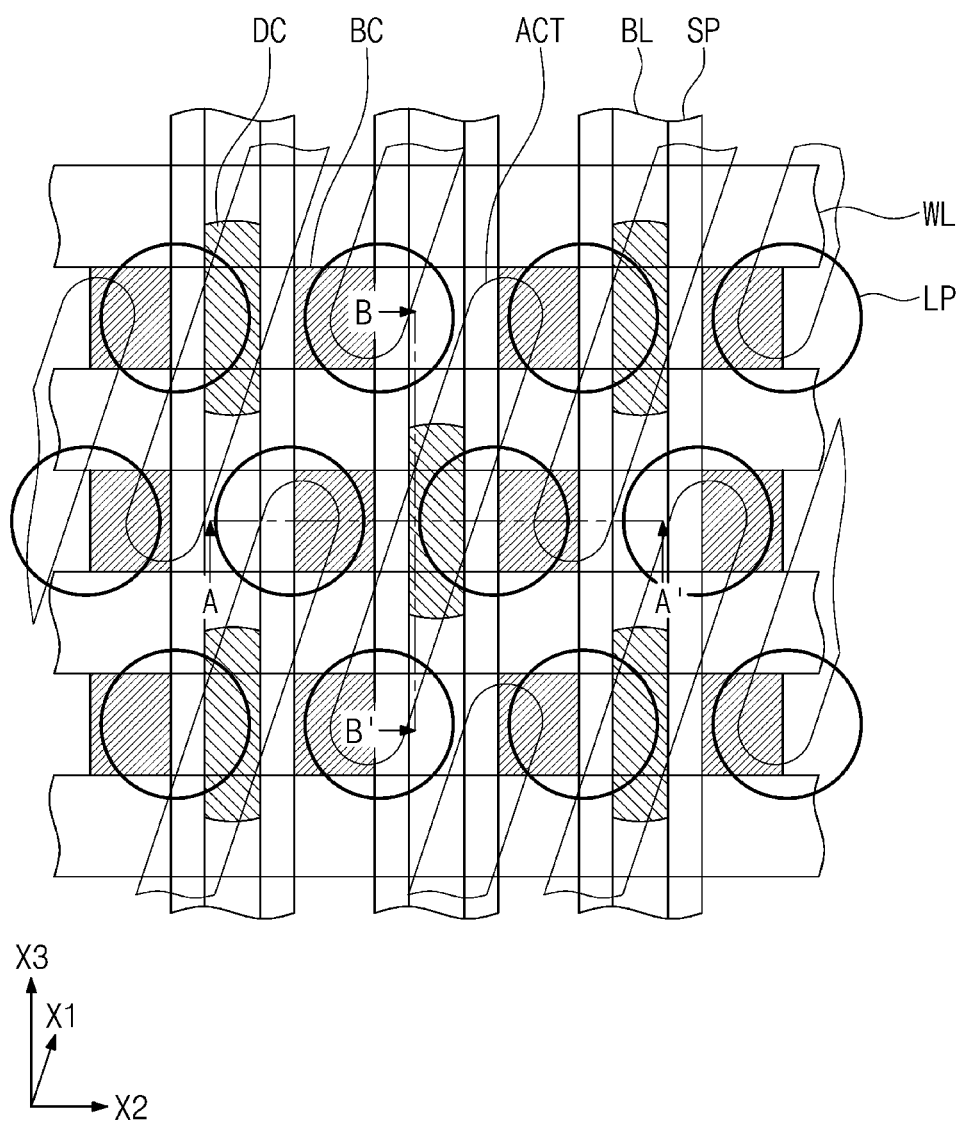
FIG. 1A is a plan view illustrating a semiconductor memory device according to embodiments of the inventive concept.
Figure 1B:
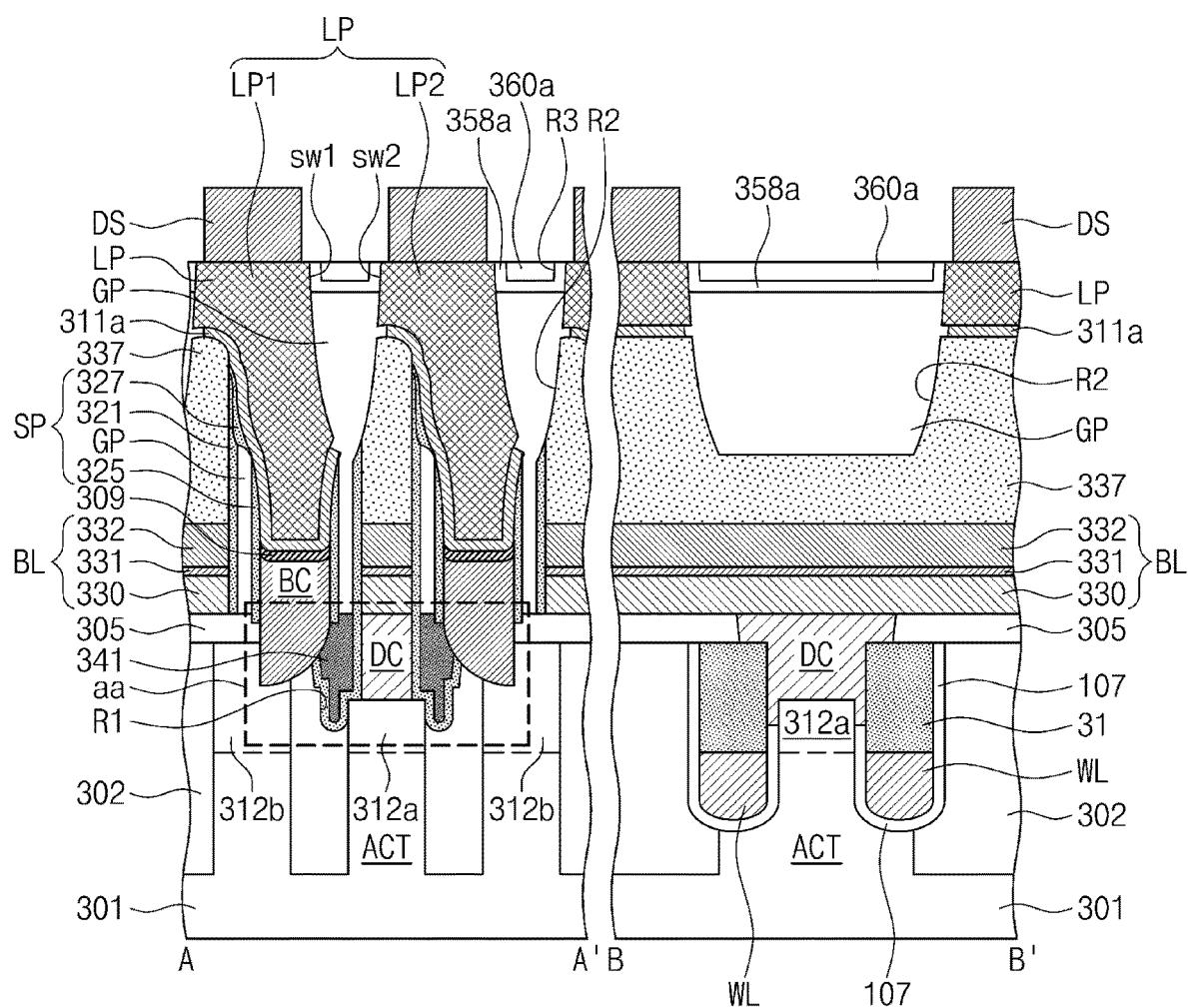
FIG. 1B is a cross-sectional view taken along lines A-A' and B-B' of FIG. 1A.
Figure 1C:
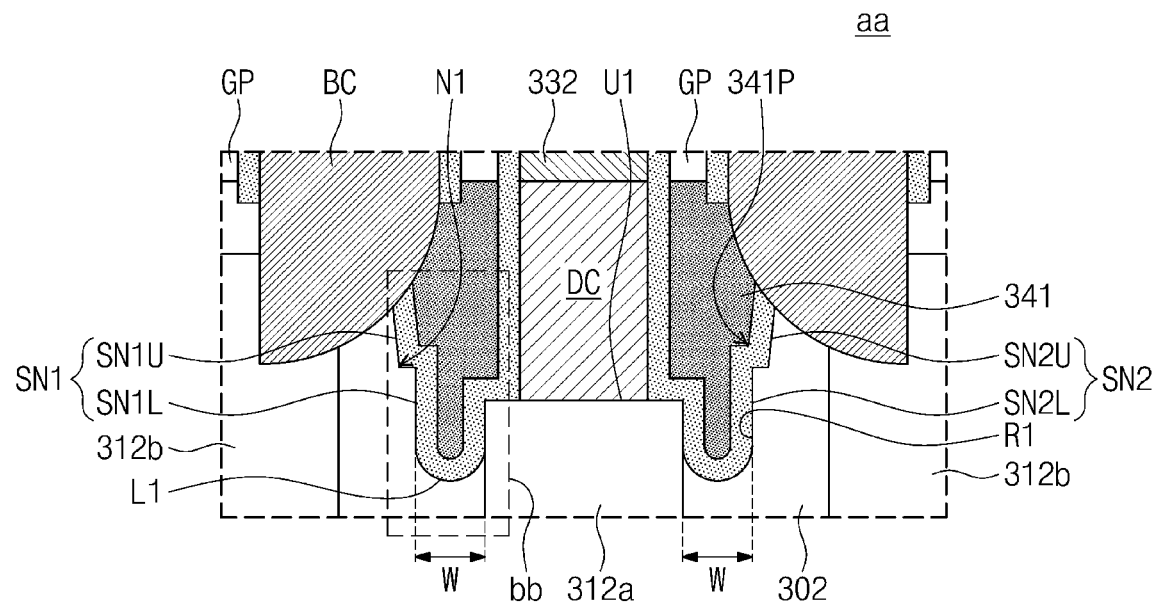
FIG. 1C is an enlarged, cross-sectional view further illustrating section 'aa' of FIG. 1B.
Figure 1D:
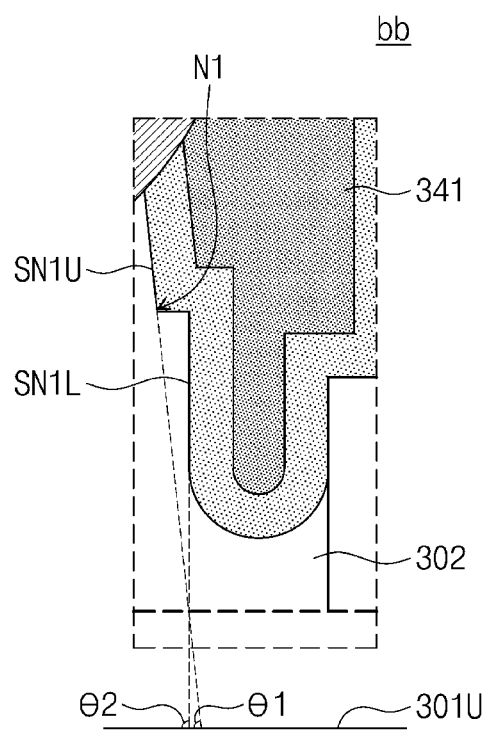
FIG. 1D is an enlarged, cross-sectional view further illustrating the section 'bb' of FIG. 1C.

Figure (FIG.) 1A is a plan (or upper down) view illustrating a semiconductor memory device according to embodiments of the inventive concept. FIG. 1B is a cross-sectional view taken along lines A-A' and B-B' of FIG. 1A; FIG. 1C is an enlarged, cross-sectional view further illustrating the section 'aa' of FIG. 1B; and FIG. 1D is an enlarged, cross-sectional view further illustrating the section 'bb' of FIG. 1C.

Referring to FIGS. 1A, 1B, 1C and 1D, active sections ACT may be defined by forming device isolation patterns 302 in a substrate 301. Each of the active sections ACT may have an isolated shape. Each of the active sections ACT may have a bar shape elongated along a first direction X1 when viewed in plan. When viewed in plan, the active sections ACT may correspond to portions of the substrate 301 that are surrounded by the device isolation patterns 302. The substrate 301 may include one or more semiconductor material(s), such as silicon, germanium substrate, silicon-germanium, etc. The device isolation patterns 302 may include one or more oxide(s) (e.g., silicon oxide). The active sections ACT may be arranged parallel to each other in the first direction X1, and one of the active sections ACT may have an end portion adjacent to a central portion of a neighboring one of the active sections ACT.

Word lines WL may extend over the active sections ACT, and may be disposed in grooves formed in the device isolation patterns 302 and the active sections ACT. The word lines WL may extend in parallel in a second direction X2 that intersects the first direction X1. The word lines WL may be formed of one or more conductive material(s). A gate dielectric layer 107 may be disposed between each of the word lines WL and an inner surface of each groove. Although not shown, the grooves may have their lower surfaces located relatively deeper in the device isolation patterns 302 and relatively shallower in the active sections ACT. The gate dielectric layer 107 may include silicon oxide. Each of the word lines WL may have a curved lower surface.

A first impurity region 312a may be disposed in the active section ACT between a respective pair of word lines WL, and a pair of second impurity regions 312b may be correspondingly disposed in opposite edges of each of the active sections ACT. The first and second impurity regions 312a and 312b may be doped with (e.g.,) N-type impurities. The first impurity region 312a may correspond to a common drain region, and the second impurity regions 312b may correspond to source regions.

When viewed in cross-section along the line A-A' of FIG. 1B or 1C, a first recess R1 may be defined by a sidewall and an upper surface of the device isolation pattern 302. The first recess R1 may have a first inner sidewall SN1 and an opposing second inner sidewall SN2. The first inner sidewall SN1 and the second inner sidewall SN2 may correspond to the sidewall of the device isolation pattern 302. Therefore, the first inner sidewall SN1 and the second inner sidewall SN2 may be called the "sidewall" of the device isolation pattern 302.

The first inner sidewall SN1 of the first recess R1 may have an upper part SN1U and a lower part SN1L. The second inner sidewall SN2 of the first recess R1 may have an upper part SN2U and a lower part SN2L.

The lower part SN1L of the first inner sidewall SN1 and the lower part SN2L of the second inner sidewall SN2 may be symmetrically disposed relative to the first impurity region 312a. In addition, the lower part SN1L of the first inner sidewall SN1 and the lower part SN2L of the second inner sidewall SN2 may be spaced apart by an interval 'W' from the first impurity region 312a.

In some embodiments, the upper part SN1U of the first inner sidewall SN1 and the upper part SN2U of the second inner sidewall SN2 may be symmetrically disposed with respect to the first impurity region 312a.

As shown in FIG. 1D, the upper part SN1U of the first inner sidewall SN1 may have a first slope θ1 relative to an upper surface 301U of the substrate 301, and the lower part SN1L of the first inner sidewall SN1 may have a second slope θ2 relative to the upper surface 301U of the substrate 301. The first slope θ1 and the second slope θ2 may be different from each other. The second slope θ2 may be closer than the first slope θ1 to 90 degrees. That is, the second slope θ2 may be less acute than the first slope θ1. The first inner sidewall SN1 may have an inflection point Ni at which a slope changes, and the inflection point Ni may be located at a position above an upper surface U1 of the first impurity region 312a.

The upper and lower parts SN2U and SN2L of the second inner sidewall SN2 may also have the same slope relationship as that between the upper and lower parts SN1U and SN1L of the first inner sidewall SN1. In some embodiments, at least one of the first inner sidewall SN1 and the second inner sidewall SN2 may have a step difference.

The first recess R1 may have a lower surface including a lowermost portion L1 disposed below the upper surface U1 of the first impurity region 312a.

Each of the word lines WL and respective, adjacent first and second impurity regions 312a and 312b may constitute a transistor. As the word lines WL are disposed in the grooves, each of the word lines WL defines a respective channel region thereunder having a length extending within a limited planar area. Accordingly, short-channel effects and the like may be reduced or minimized.

The word lines WL may have respective upper surfaces below the active sections ACT. A word-line capping pattern 31 may be disposed on each of the word lines WL. The word-line capping patterns 31 may have linear shapes that extend along longitudinal directions of the word lines WL and may cover the respective upper surfaces of the word lines WL. Each of the grooves may include an unoccupied inner space not occupied by the word lines WL, and the word-line capping patterns 31 may fill the unoccupied inner spaces of the grooves. The word-line capping pattern 31 may be formed of (e.g.,) a silicon nitride layer.

When viewed in cross-section along the line B-B' of FIG. 1B, the gate dielectric layer 107—between the first impurity region 312a and the word-line capping pattern 31—may have an upper surface below the upper surface U1 of the first impurity region 312a. The gate dielectric layer 107—between the word-line capping pattern 31 and the device isolation pattern 302—may have an upper surface that is coplanar with the word-line capping pattern 31.

A buffer pattern 305 may be disposed on the substrate 301. The buffer pattern 305 may include the same material (s) as the device isolation pattern 302. For example, the buffer pattern 305 may be a single layer including silicon oxide.

The buffer pattern 305 may be formed in island shapes that are spaced apart from each other when viewed in plan. The buffer pattern 305 may be formed to cover end portions of two adjacent active sections ACT.

The substrate 301, the device isolation pattern 302, and the buffer pattern 305 may be partially recessed to form the first recess R1.

Bit lines BL may be disposed on the buffer pattern 305. The bit lines BL may extend over the word-line capping patterns 31 and the word lines WL. As shown in FIG. 1A, the bit lines BL may extend in parallel in a third direction X3 that intersects the first and second directions X1 and X2. Each of the bit lines BL may include a bit-line polysilicon pattern 330, a bit-line ohmic pattern 331, and a bit-line metal-containing pattern 332 that are sequentially stacked. The bit-line polysilicon pattern 330 may include impurity-doped polysilicon and/or impurity-undoped polysilicon. The bit-line ohmic pattern 331 may include a metal silicide layer. The bit-line metal-containing pattern 332 may include at least one selected from metal (e.g., tungsten, titanium, and tantalum) and conductive metal nitride (e.g., titanium nitride, tantalum nitride, and tungsten nitride). A bit-line capping pattern 337 may be disposed on each of the bit lines BL. The bit-line capping patterns 337 may be formed of one or more dielectric material(s). For example, the bit-line capping patterns 337 may include one or more nitride(s) (e.g., silicon nitride) and/or oxynitride (e.g., silicon oxynitride).

A bit-line contact DC may be disposed in the first recess R1. The bit-line contact DC may include impurity-doped polysilicon and/or impurity-undoped polysilicon. When viewed in cross-section along the line B-B' of FIG. 1B, the bit-line contact DC may have a sidewall in contact with a lateral surface of the buffer pattern 305. When viewed in plan as shown in FIG. 1A, the bit-line contact DC may have a convex lateral surface in contact with the buffer pattern 305. The bit-line contact DC may electrically connect the first impurity region 312a and the bit line BL to each other.

When viewed in cross-section along the line B-B' of FIG. 1B, the bit-line contact DC may be at least partially interposed between the first impurity region 312a and the word-line capping pattern 31. The bit-line contact DC may contact upper and lateral surfaces of the first impurity region 312a.

The first recess R1 may include an unoccupied space that is not occupied by the bit-line contact DC, and lower buried dielectric pattern 341 may fill the unoccupied space of the first recess R1. The first recess R1 may be provided therein with a pair of lower buried dielectric patterns 341 on opposite sides of the bit-line contact DC. The lower buried dielectric patterns 341 may include, for example, a silicon nitride layer. Each of the lower buried dielectric patterns 341 may have a lower width and an upper width greater than the lower width. One of the lower buried dielectric patterns 341 may have a sidewall whose shape is transferred from the first inner sidewall SN1 of the first recess R1. Another of the lower buried dielectric patterns 341 may have a sidewall whose shape is transferred from the second inner sidewall SN2 of the first recess R1. The sidewall of each of the lower buried dielectric patterns 341 may have an inflection point 341P at which a slope changes, and the inflection point 341P may be located above the upper surface U1 of the first impurity region 312a.

Storage node contacts BC may be disposed between respective pairs of neighboring bit lines BL. The storage node contacts BC may be spaced apart from each other. The storage node contacts BC may include impurity-doped polysilicon and/or impurity-undoped polysilicon. Between the bit lines BL, a dielectric pattern (not shown) may be disposed between the storage node contacts BC.

A bit-line spacer SP may be interposed between the bit line BL and the storage node contact BC. The bit-line spacer SP may include a first sub-spacer 321 and a second sub-spacer 325 that are spaced apart from each other across a gap region GP. Here, the gap region GP may be referred to as an "air gap." The first sub-spacer 321 may cover a sidewall of the bit line BL and a sidewall of the bit-line capping pattern 337. The second sub-spacer 325 may be adjacent to the storage node contact BC. The first sub-spacer 321 and the second sub-spacer 325 may include the same material. For example, the first sub-spacer 321 and the second sub-spacer 325 may include a silicon nitride layer.

The second sub-spacer 325 may have a lower surface below that of the first sub-spacer 321. The second sub-spacer 325 may have an upper end below an upper end of the first sub-spacer 321. Such a configuration may increase a formation margin for landing pads LP which will be described hereafter. As a result, disconnection between the landing pad LP and the storage node contact BC may be prevented. The first sub-spacer 321 may extend to cover a sidewall of the bit-line contact DC and also to cover a sidewall and a lower surface of the first recess R1. For example, the first sub-spacer 321 may be interposed between the bit-line contact DC and the lower buried dielectric pattern 341, between the word-line capping pattern 31 and the lower buried dielectric pattern 341, between the substrate 301 and the lower buried dielectric pattern 341, and between the device isolation pattern 302 and the lower buried dielectric pattern 341.

A storage node ohmic layer 309 may be disposed on the storage node contact BC. The storage node ohmic layer 309 may include metal silicide. The storage node ohmic layer 309, the first and second sub-spacers 321 and 325, and the bit-line capping pattern 337 may be conformally covered with a diffusion supper pattern 311a. The diffusion supper pattern 311a may include metal nitride (e.g., a titanium nitride layer, a tantalum nitride layer, etc.). A landing pad LP may be disposed on the diffusion supper pattern 311a. The landing pad LP may include one or more metals (e.g., tungsten). The landing pad LP may have an upper part that covers an upper surface of the bit-line capping pattern 337 and that has a width greater than that of the storage node contact BC. A center of the landing pad LP may shift away in the second direction X2 from a center of the storage node contact BC. A portion of the bit line BL may vertically overlap the landing pad LP. An upper sidewall of the bit-line capping pattern 337 may overlap the landing pad LP and may be covered with a third sub-spacer 327. A second recess R2 may be formed on other upper sidewall of the bit-line capping pattern 337.

The landing pads LP may include a first landing pad LP1 and a neighboring second landing pad LP2. The first landing pad LP1 may have a first upper sidewall sw1 adjacent to the second landing pad LP2. The second landing pad LP2 may have a second upper sidewall sw2 adjacent to the first upper sidewall sw1. A first capping pattern 358a may connect the first upper sidewall sw1 and the second sidewall sw2 to each other, while covering the first and second upper sidewalls sw1 and sw2. The first capping pattern 358a may have a uniform thickness regardless of position. The first capping pattern 358a may have a third recess R3 between the first and second landing pads LP1 and LP2. The third recess R3 may be filled with a second capping pattern 360a. The first and second capping patterns 358a and 360a may independently include a silicon nitride layer, a silicon oxide layer, a silicon oxynitride layer, or a porous layer. The first capping pattern 358a may have porosity greater than that of the second capping pattern 360a. The first and second capping patterns 358a and 360a may have coplanar upper surfaces with those of the landing pads LP.

The gap region GP between the first and second subspacers 321 and 325 may extend into a space between the landing pads LP. The gap region GP may expose a lower surface of the first capping pattern 358a. The gap region GP may extend toward the diffusion supper pattern 311a. For example, the diffusion supper pattern 311a may have a sidewall that is recessed between the second landing pad LP2 and the bit-line capping pattern 337. The gap region GP may partially expose an upper surface of the bit-line capping pattern 337 and a lower surface of the second landing pad LP2.

A data storage pattern DS may be disposed on the landing pad LP. The data storage pattern DS may include a capacitor lower electrode, a phase change material pattern, a variable resistance material pattern, and/or a magnetic tunnel junction pattern.

Each of FIGS. 2A, 3A, 4A, 5A, 6A, 7A, 8A, 9A and 10A is a plan view, and each of FIGS. 2B, 2C, 3B, 3C, 4B, 5B, 6B, 7B, 8B, 9B, 10B, 10C, 11, 12, 13, and 14 is a cross-sectional view that collectively illustrate in one example a fabrication method for a semiconductor memory device according to embodiments of the inventive concept.

Figure 2A:
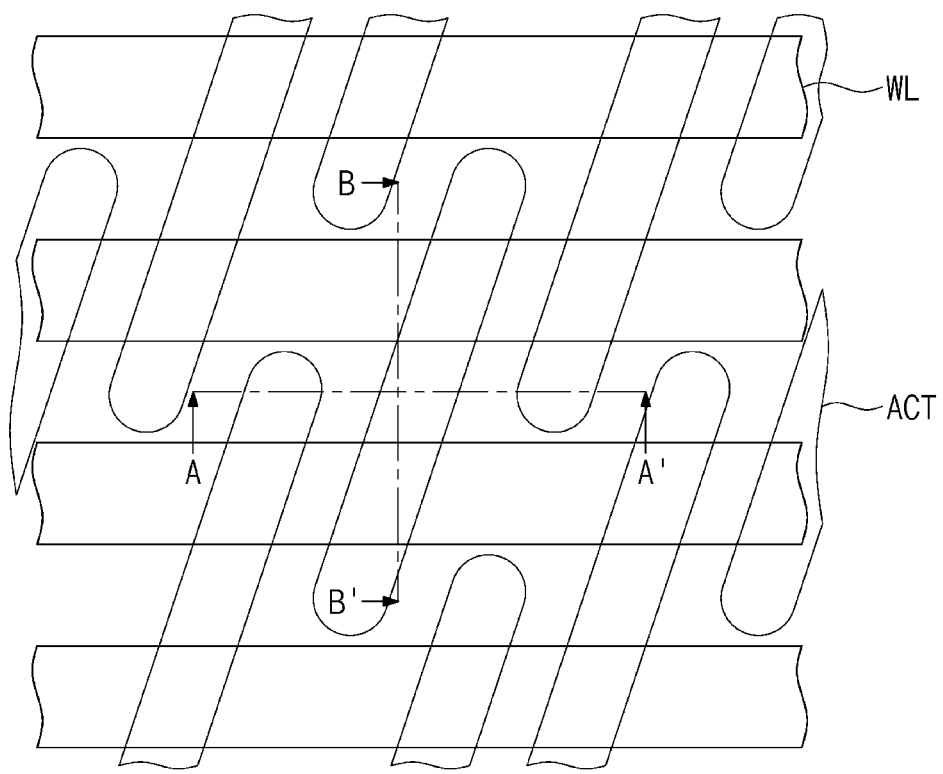
FIGS. 2A, 3A, 4A, 5A, 6A, 7A, 8A, 9A and 10A are respective plan views.
Figure 2B:
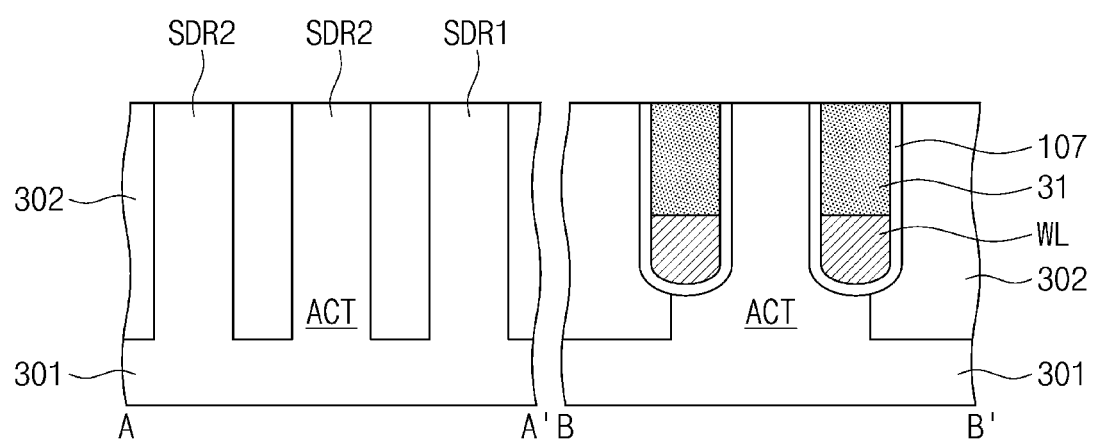
FIGS. 2B, 2C, 3B, 3C, 4B, 5B, 6B, 7B, 8B, 9B, 10B, 10C, 11, 12, 13, and 14 are respective cross-sectional views that collectively illustrate in one example a fabrication method for a semiconductor memory device according to embodiments of the inventive concept.

Referring to FIGS. 2A and 2B, device isolation patterns 302 may be formed in a substrate 301 to define active sections ACT. A device isolation trench may be formed in the substrate 301, and the device isolation patterns 302 may fill the device isolation trench. The active sections ACT and the device isolation patterns 302 may be patterned to form grooves. Here, etching conditions for the substrate 301 and the device isolation patterns 302 may be properly controlled such that the device isolation patterns 302 may be more easily etched than the substrate 301. As a result, the grooves may have curved lower surfaces.

Word lines WL may be formed in corresponding grooves. A pair of word lines WL may extend over each of the active sections ACT. The pair of word lines WL may divide each of the active sections ACT into a first source/drain region SDR1 and a pair of second source/drain regions SDR2. The first source/drain region SDR1 may be defined between the pair of word lines WL, and the pair of second source/drain regions SDR2 may be defined on opposite edges of each of the active sections ACT.

Before the word lines WL are formed, a gate dielectric layer 107 may be formed on an inner surface of each of the grooves. The gate dielectric layer 107 may be formed by one or more of thermal oxidation, chemical vapor deposition, and atomic layer deposition. A gate conductive layer may be formed to fill the grooves, and then the gate conductive layer may be etched-back to form the word lines WL. The word lines WL may be recessed to have their upper surfaces lower than those of the active sections ACT. A dielectric layer, such as a silicon nitride layer, may be formed on the substrate 301 so as to fill the grooves, and then the dielectric layer may be etched to form word-line capping patterns 31 on corresponding word lines WL.

Figure 2C:
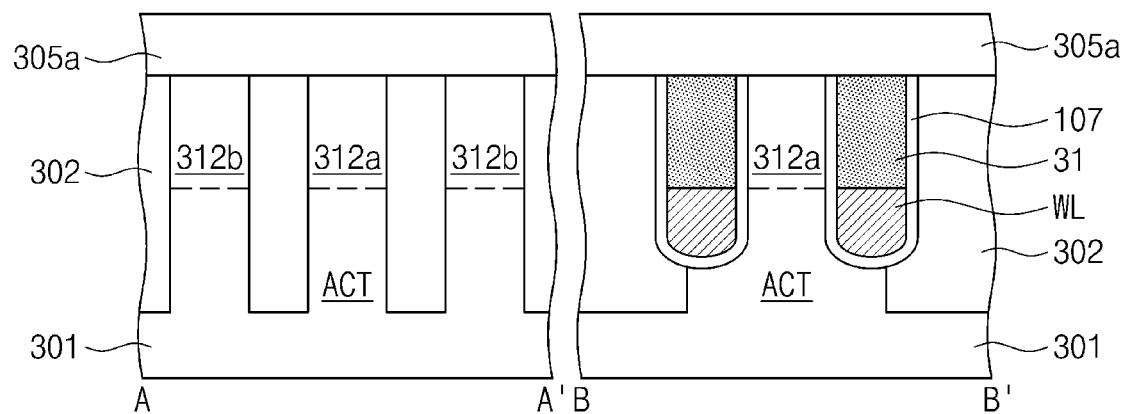

Referring to FIGS. 2A and 2C, the word-line capping patterns 31 and the device isolation patterns 302 may be used as a mask to dope the active sections ACT with impurities to form first and second impurity regions 312a and 312b. The first impurity region 312a and the second impurity regions 312b may be formed respectively in the first source/drain region SDR1 and the second source/drain regions SDR2 shown in FIG. 2B.

Then, a buffer layer 305a (e.g., silicon oxide) may be formed on an entire surface of the substrate 301.

Figure 3A:
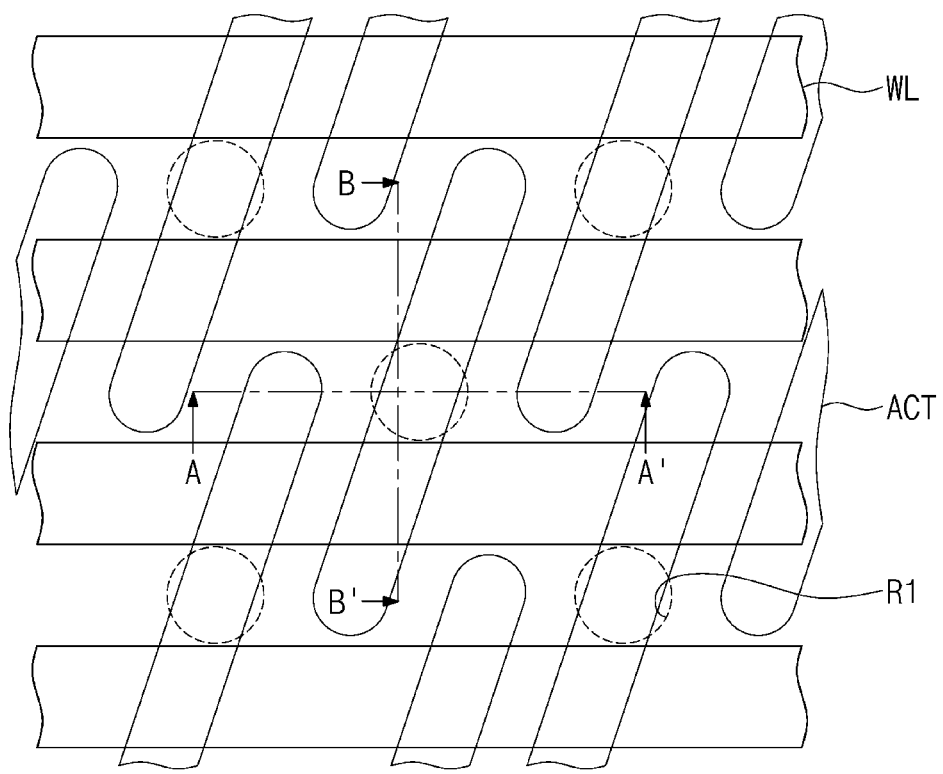
Figure 3B:
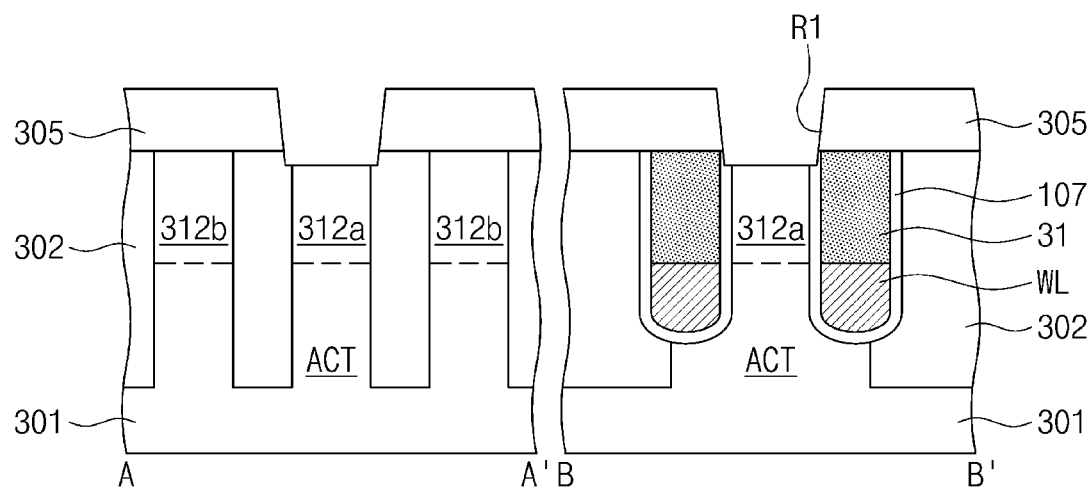

Referring to FIGS. 3A and 3B, a separate etching mask (not shown) may be used to anisotropically etch the buffer layer 305a to form a buffer pattern 305 including a first recess R1 that exposes the first impurity region 312a.

The etching mask (not shown) may have an opening whose size is slightly greater than that required to expose the first impurity region 312a. For example, the opening size of the etching mask (not shown) may be a sum of a width in the second direction X2 of the active section ACT and An additional width margin provided for misalignment.

The buffer layer 305a, the device isolation pattern 302, the substrate 301, and the first impurity region 312a may be etched to form the first recess R1 and simultaneously to form the buffer pattern 305. As the first recess R1 has a horizontal width sufficient to expose the first impurity region 312a, the first recess R1 may be formed to have a sidewall closer to the first impurity region 312a than to the second impurity regions 312b on other active sections ACT.

Figure 3C:
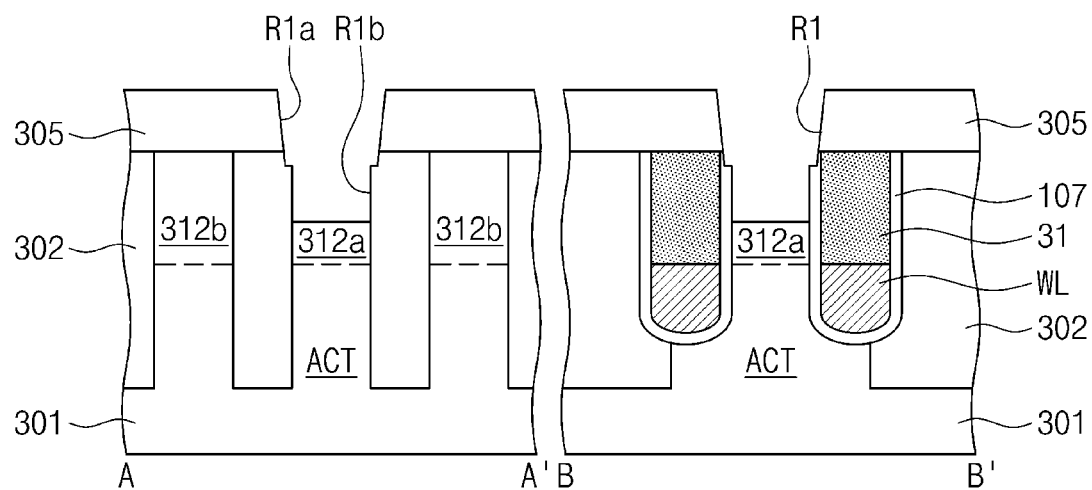

Referring to FIGS. 3A and 3C, the first impurity region 312a exposed by the buffer pattern 305 may be selectively etched. Because the first impurity region 312a includes silicon and the device isolation pattern 302, the buffer pattern 305, and the gate dielectric layer 107 include silicon oxide, the first impurity region 312a may be selectively etched due to its etch selectivity with respect to the device isolation pattern 302, the buffer pattern 305, and the gate dielectric layer 107. The first impurity region 312a may be etched such that the first recess R1 may expand to include a first part R1a that has a first slope on a sidewall of the buffer pattern 305 and a second part R1b that has a second slope on a sidewall of the device isolation pattern 302. For example, the first recess R1 may have an increased depth. The first slope and the second slope may be different. For example, the second slope may be less acute (i.e., closer to 90 degrees) that that of the first slope. Afterwards, the etching mask (not shown) is removed. In some embodiments, the etching mask may be removed before the first impurity region 312a is selectively etched.

Figure 4A:
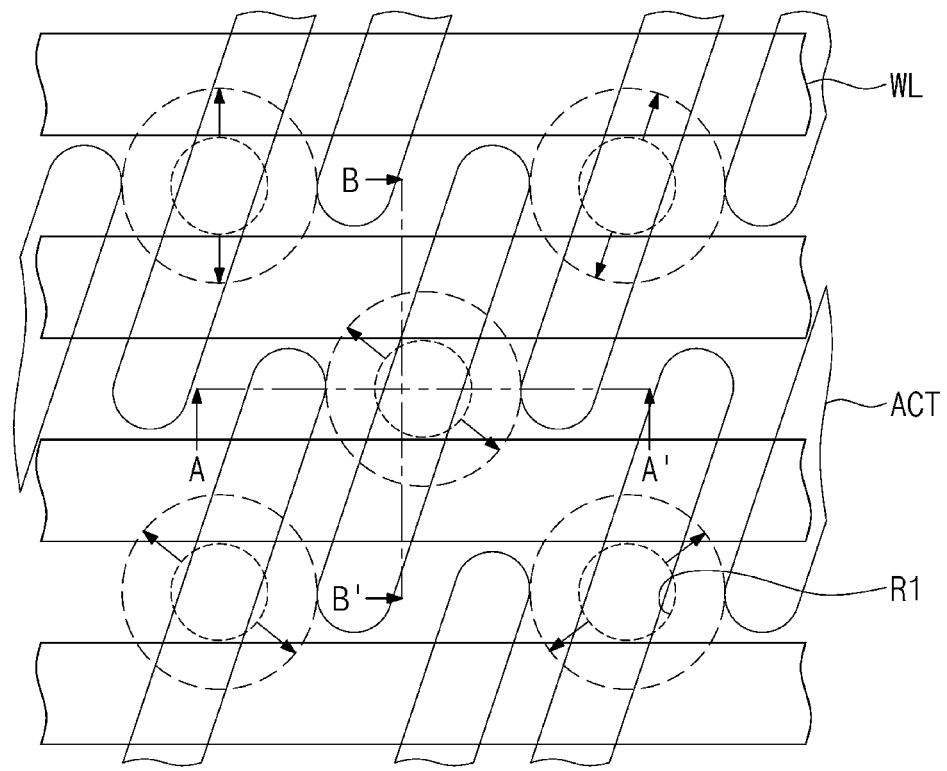
Figure 4B:
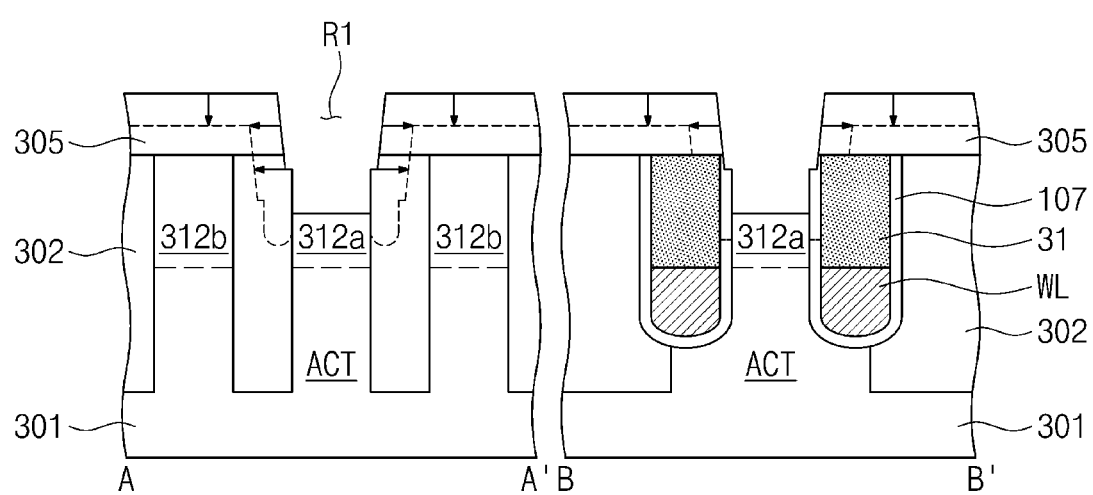

Referring to FIGS. 4A, 4B, 5A, and 5B, an isotropic etching process may be performed to expand the first recess R1. A wet etching process may be used as the isotropic etching process. In this case, the first recess R1 may have increased widths in both the vertical and horizontal directions. The isotropic etching process may etch an exposed sidewall of each of the buffer pattern 305 and the device isolation pattern 302. As the buffer pattern 305 and the device isolation pattern 302 may include the same material (s), exposed portions of both the buffer pattern 305 and the device isolation pattern 302 may be similarly etched during the isotropic etching process. Therefore, as shown in FIG. 4B, a profile of the exposed sidewall of the buffer pattern 305 may be transferred, and likewise a profile of the exposed sidewall of the device isolation pattern 302 may be transferred. According to some embodiments, a linear line may be provided between the exposed sidewall of the buffer pattern 305 and the exposed sidewall of the device isolation pattern 302.

The first recess R1 may have a first inner sidewall SN1 and an opposing second inner sidewall SN2. Here, the first inner sidewall SN1 and the second inner sidewall SN2 may be formed to have respective lower parts that are spaced apart at the same interval 'W' from the first impurity region 312a.

Figure 5A:
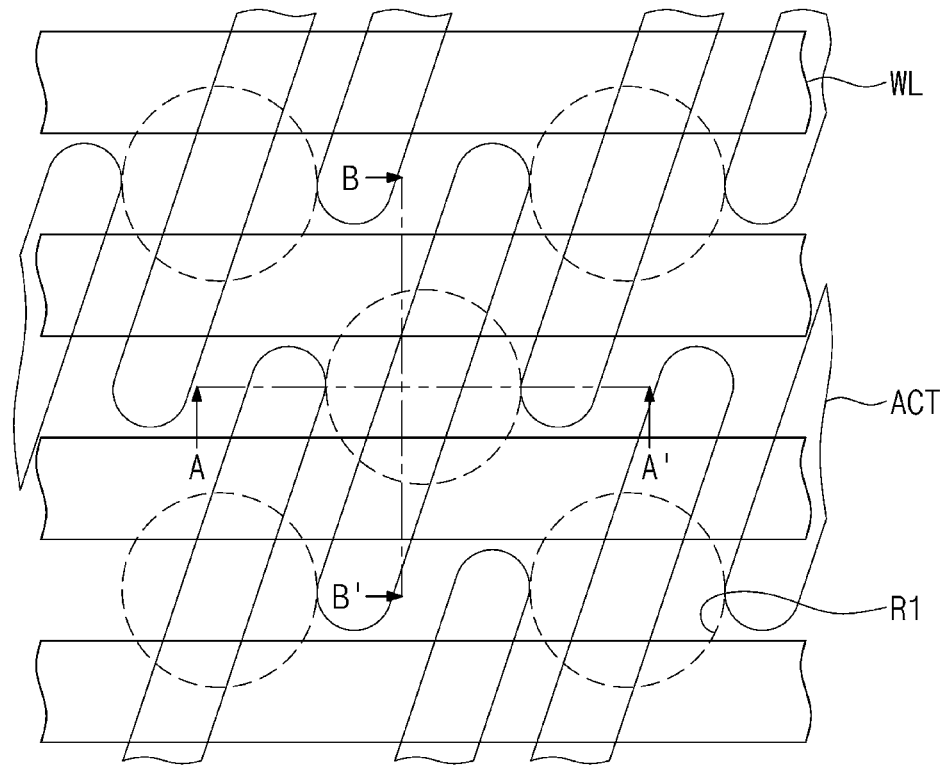
Figure 5B:
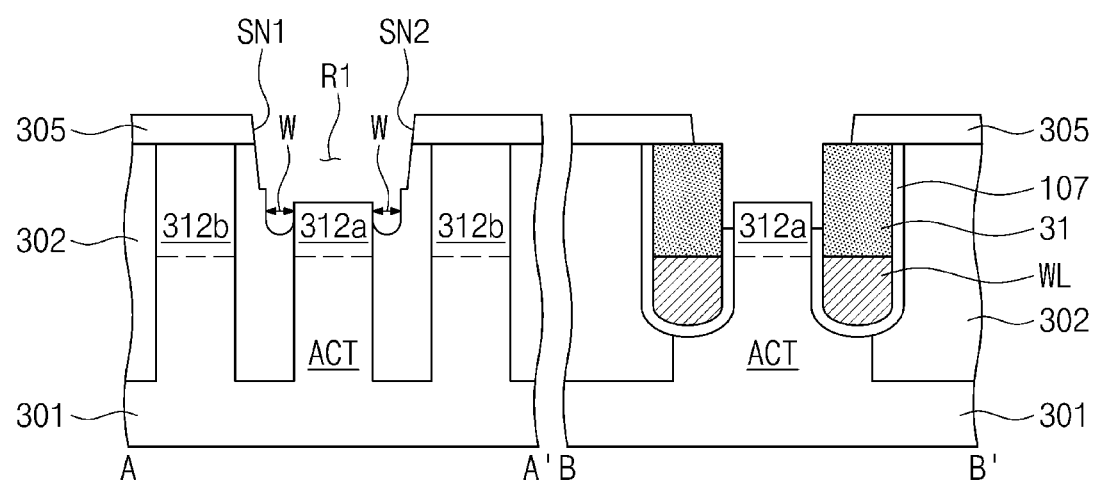

When the first recess R1 expands, the device isolation pattern 302 adjacent to the second part R1b of the first recess R1 shown in FIG. 3C may be etched by the same amount on opposite sides of the first impurity region 312a, and accordingly the first recess R1 may be formed to have the same interval 'W' at its portions spaced apart from each other across the first impurity region 312a. Therefore, as shown in FIG. 5B, the first recess R1 may have the first inner sidewall SN1 and the opposing second inner sidewall SN2, and a lower part of the first inner sidewall SN1 and a lower part of the second inner sidewall SN2 may be formed symmetrically to each other with respect to the first impurity region 312a. In addition, the first recess R1 may be formed have a lower surface whose lowermost portion is lower than an upper surface of the first impurity region 312a.

The first impurity region 312a may have a fin-type shape with an exposed upper surface and partially exposed sidewall. As shown in the cross-sectional view of FIG. 5B, the gate dielectric layer 107 may also be partially etched to expose the sidewall of the first impurity region 312a.

Figure 6A:
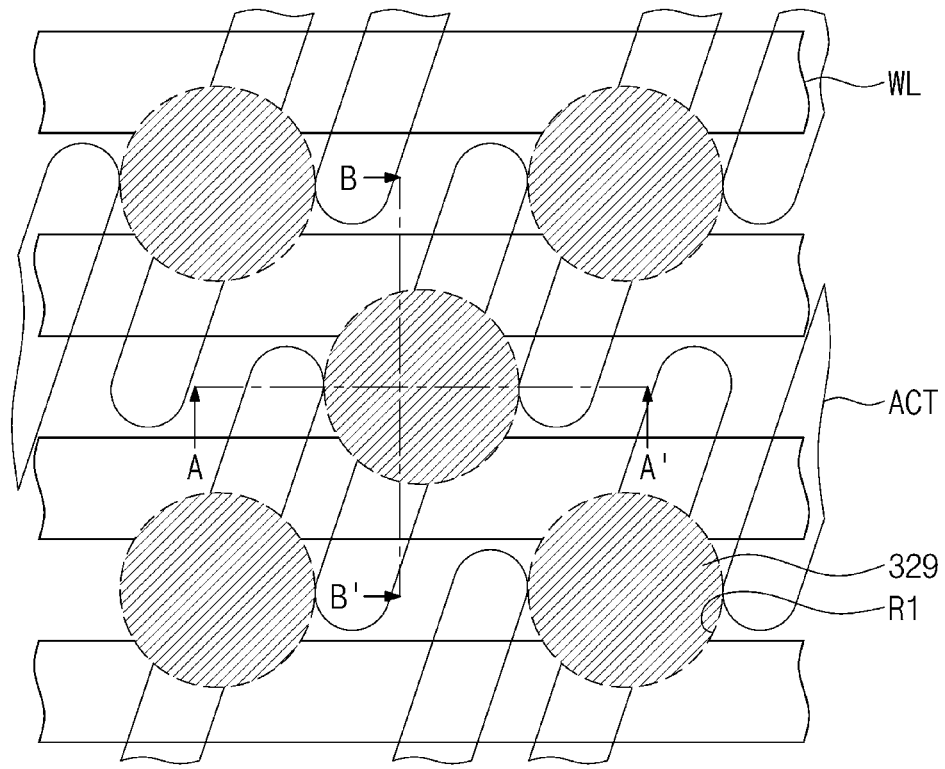
Figure 6A:
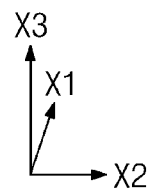
Figure 6B:
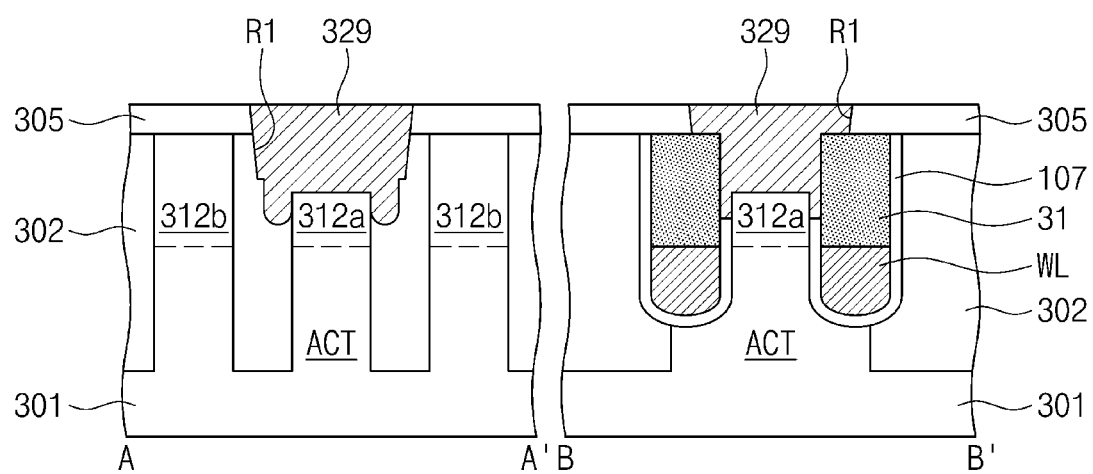

Referring to FIGS. 6A and 6B, a first polysilicon layer 329 may be formed on the entire surface of the substrate 301, thereby filling the first recess R1. The first polysilicon layer 329 may undergo a planarization etching process to expose the buffer pattern 305. The first polysilicon layer 329 and the buffer pattern 305 may constitute a substantially planar surface.

Figure 7A:
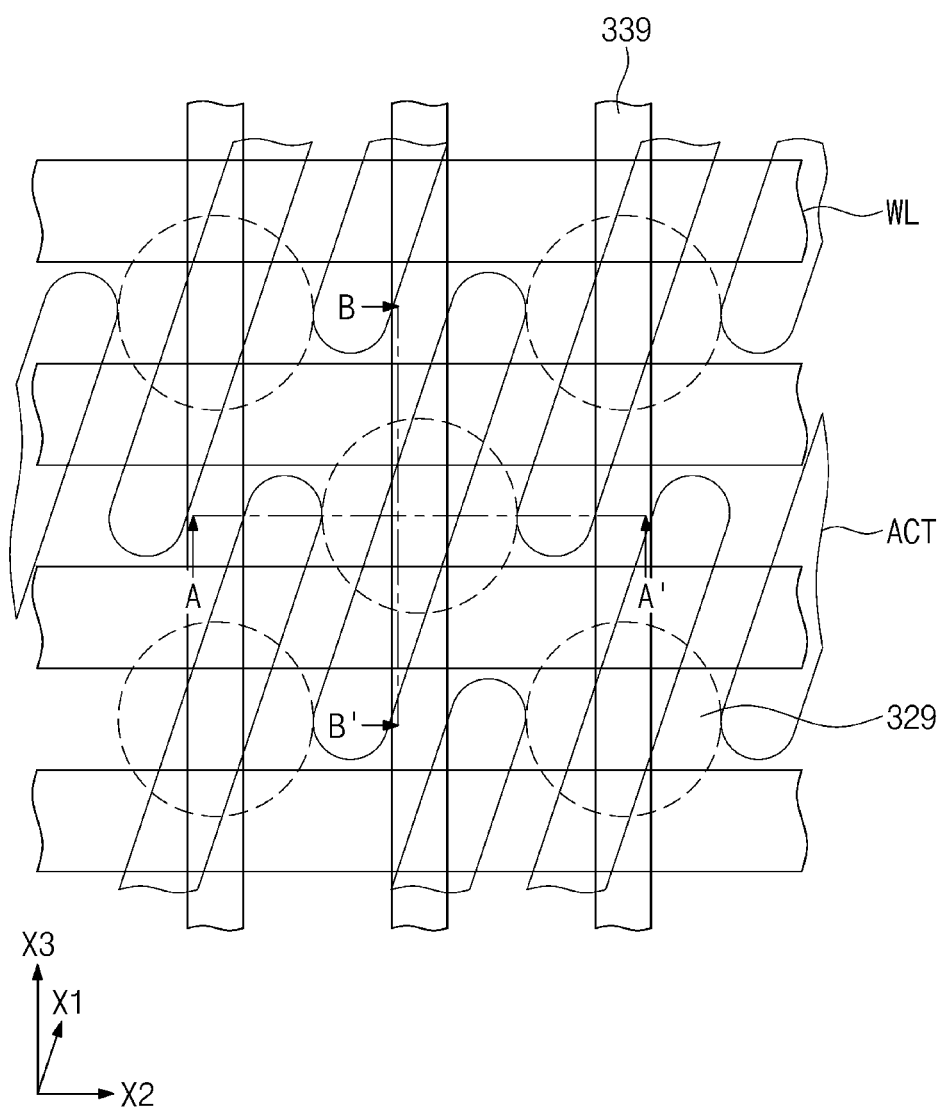
Figure 7B:
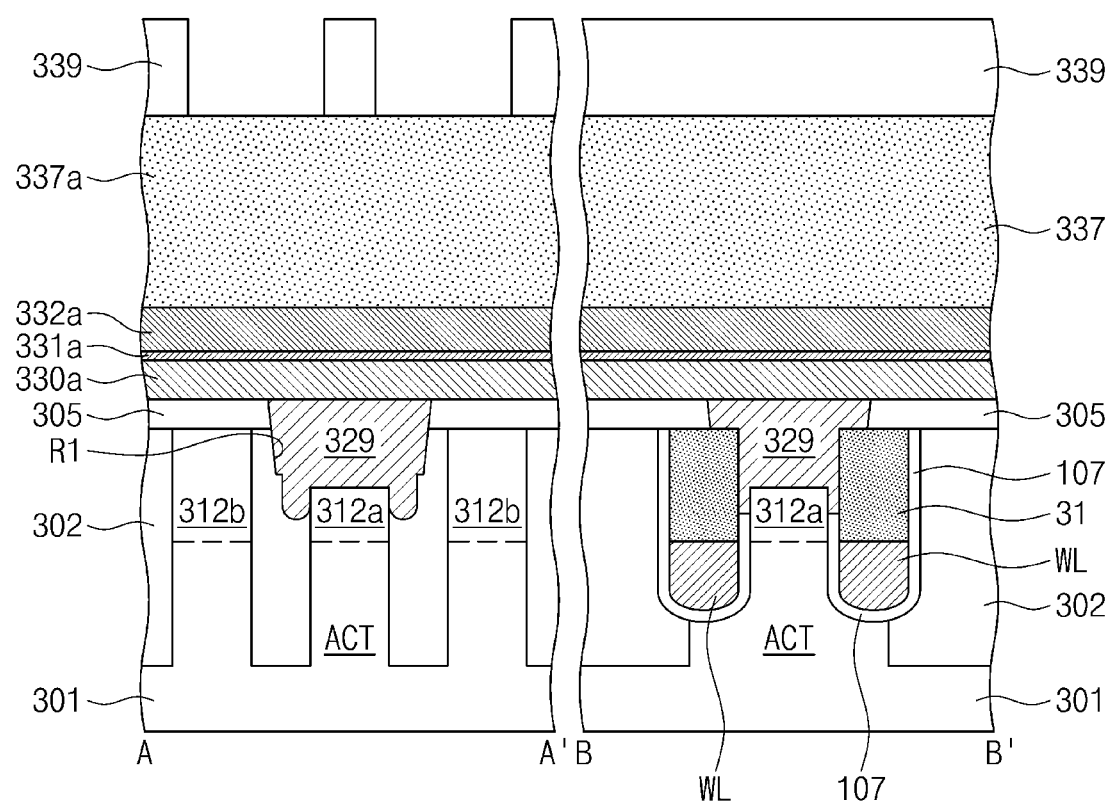

Referring to FIGS. 7A and 7B, a second polysilicon layer 330a may be formed on the buffer pattern 305 and the first polysilicon layer 329. A bit-line ohmic layer 331a, a bit-line metal-containing layer 332a, and a bit-line capping layer 337a may be sequentially formed on the second polysilicon layer 330a. The bit-line ohmic layer 331a may be formed of metal silicide (e.g., cobalt silicide). The bit-line ohmic layer 331a may be formed by depositing a metal layer on the second polysilicon layer 330a, performing an annealing process in which the metal layer and polysilicon of the second polysilicon layer 330a react with each other to form metal silicide, and then removing a non-reacted portions of the metal layer.

First mask patterns 339 may be formed on the bit-line capping layer 337a, defining planar shapes of bit lines BL which will be described hereafter. The first mask patterns 339 may extend in the third direction X3.

Figure 8A:
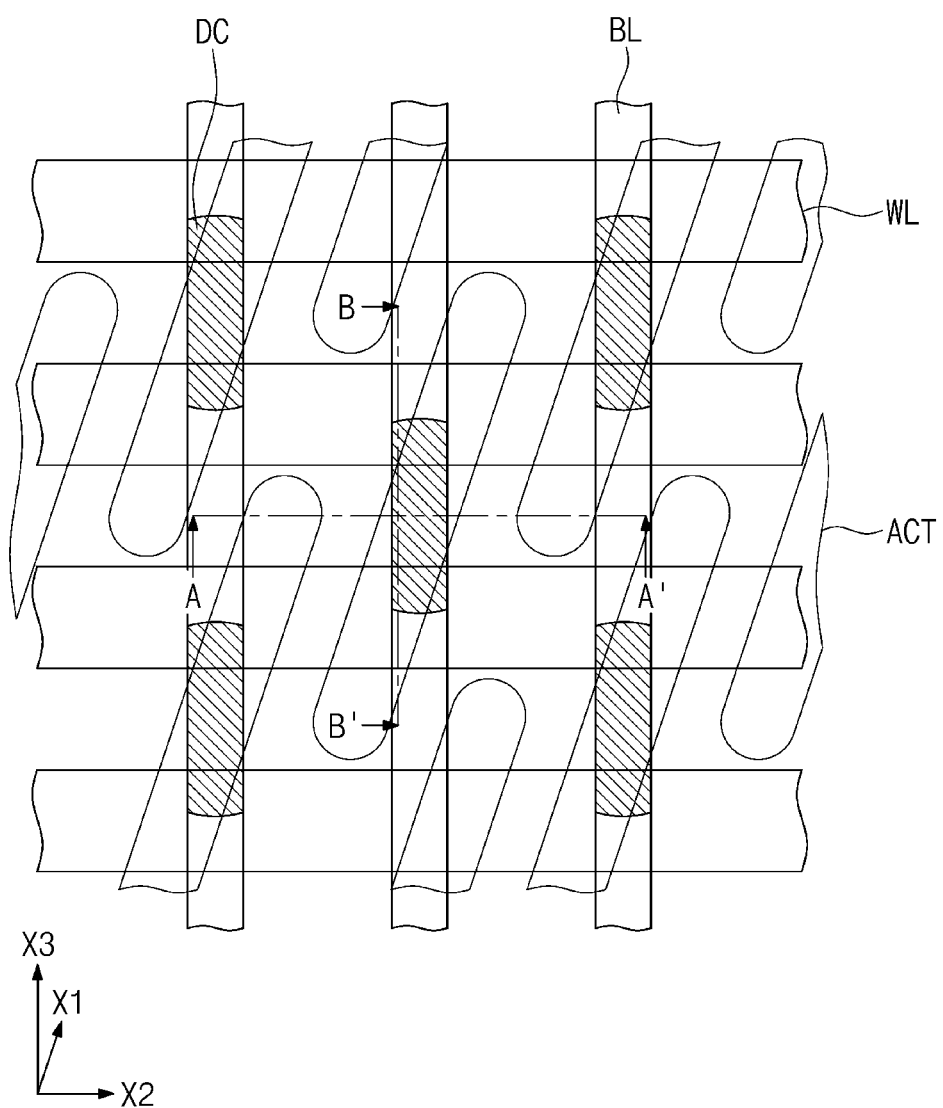
Figure 8B:
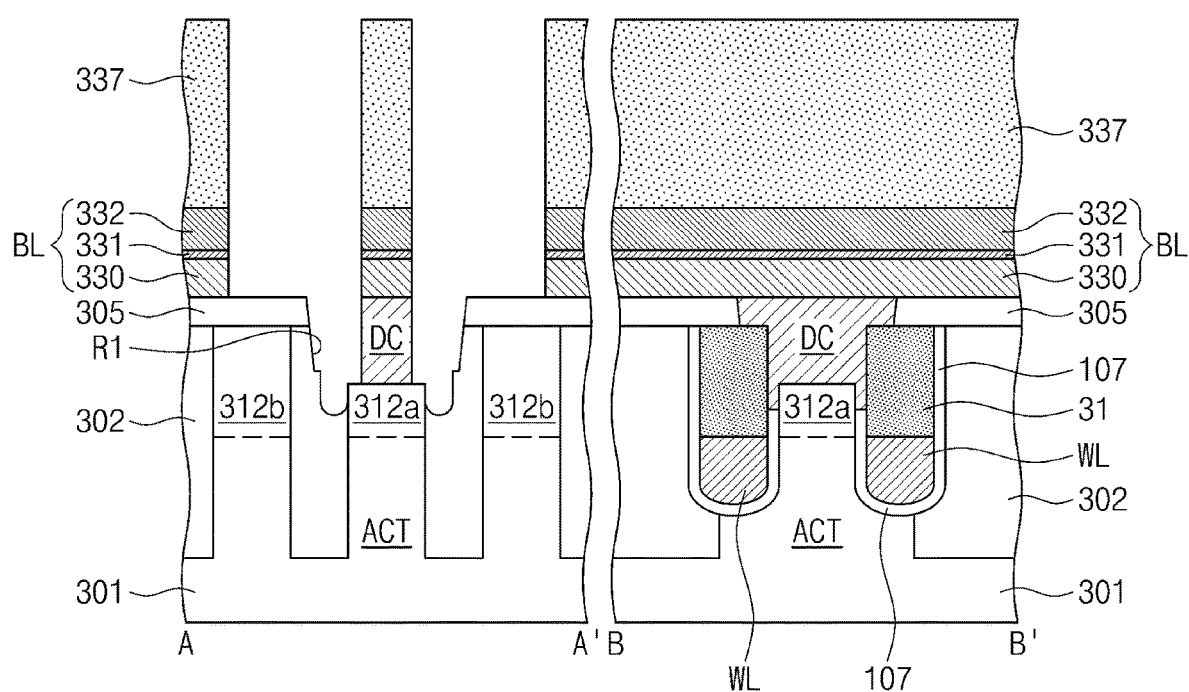

Referring to FIGS. 8A and 8B, the first mask patterns 339 may be used as an etching mask during the performing of an etching process in which the bit-line capping layer 337a, the bit-line metal-containing layer 332a, the bit-line ohmic layer 331a, the second polysilicon layer 330a, and the first polysilicon layer 329 are sequentially etched to form a bit-line capping pattern 337, a bit-line contact DC, and a bit line BL that includes a bit-line polysilicon pattern 330, a bit-line ohmic pattern 331, and a bit-line metal-containing pattern 332. The etching process may partially expose an upper surface of the buffer pattern 305, an inner sidewall of the first recess R1, and a portion of the lower surface of first recess R1. The first mask patterns 339 may then be removed.

When the bit-line contact DC is formed, the first polysilicon layer 329 exposed by the first mask pattern 339 may be removed to expose the inner sidewall of the first recess R1. In a case where misalignment occurs when the first mask pattern 339 is formed, a reduced horizontal distance may be provided between a sidewall of the first mask pattern 339 and the inner sidewall of the first recess R1. In this case, when the bit-line contact DC is formed, the introduction of an etchant between the first polysilicon layer 329 and the inner sidewall of the first recess R1 may be difficult, and thus the first polysilicon layer 329 may be insufficiently etched to form the bit-line contact DC having a bridge shape that covers the inner sidewall of the first recess R1. This may increase the likelihood that a short-circuit between the bit-line contact DC and a storage node contact (see, e.g., element 'BC' of FIG. 1B).

According to embodiments of the inventive concept, a space into which an etchant is introduced around the first impurity region 312a may expand due to the etching process for implementing a shallow etching depth required to expose the first impurity region 312a (as described with respect to FIG. 3B), due to the selective etching process in which the first impurity region 312a is selectively etched (as described with respect to FIG. 3C), and due to the isotropic etching process performed around the first impurity region 312a (as described in relation to FIG. 4B). For example, because a space sufficiently large to facilitate the introduction of an etchant is formed around the first impurity region 312a, and because the first recess R1 has a sufficiently space to receive an etchant, a lower part of the first polysilicon layer 329 may be sufficiently etched when the bit-line contact DC is formed. Accordingly, it is be possible to markedly reduce certain process defects such as short-circuits.

Figure 9A:
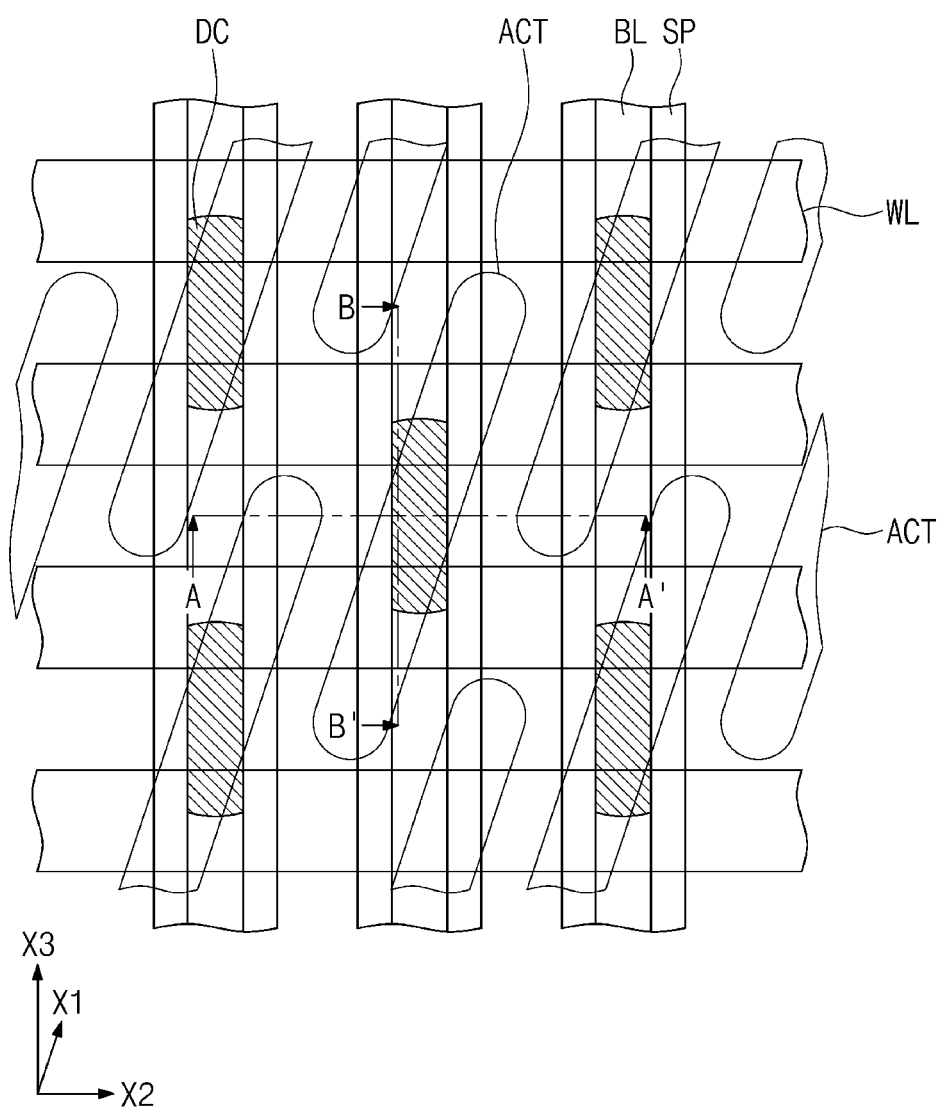
Figure 9B:
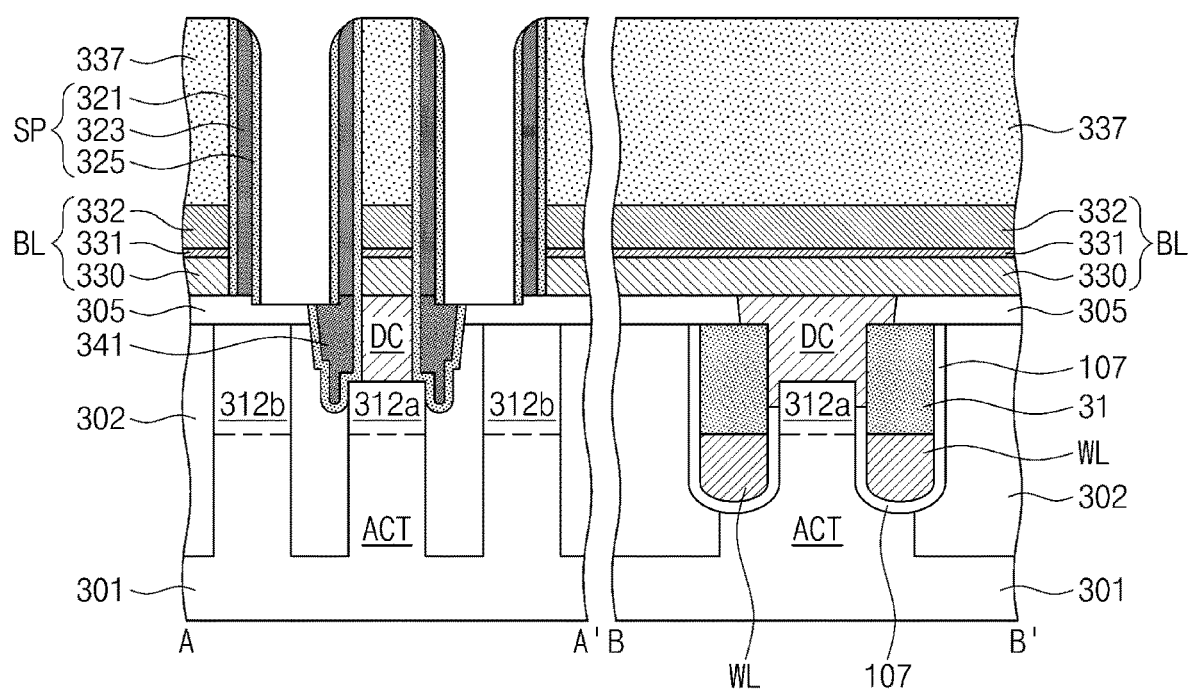

Referring to FIGS. 9A and 9B, a first sub-spacer layer may be conformally formed on the entire surface of the substrate 301. The first sub-spacer layer may conformally cover a lower surface and an inner sidewall of the third recess R3. The first sub-spacer layer may be, for example, a silicon nitride layer. A dielectric layer, such as a silicon nitride layer, may be formed on the entire surface of the substrate 301 so as to fill the first recess R1, and then an anisotropic etching process may be performed in which the dielectric layer is anisotropically etched to leave a lower buried dielectric pattern 341 in the first recess R1.

When the anisotropic etching process is performed, the first sub-spacer layer may also be etched to form a first sub-spacer 321. In addition, the anisotropic etching process may expose the upper surface of the buffer pattern 305. A sacrificial spacer layer may be conformally formed on the entire surface of the substrate 301, and then an anisotropic etching process may be performed to form a sacrificial spacer 323 that covers a sidewall of the first sub-spacer 321. The sacrificial spacer 323 may be formed of material(s) having an etch selectivity with respect to the first sub-spacer 321. A second sub-spacer 325 may be formed to cover a sidewall of the sacrificial spacer 323. The second sub-spacer 325 may be formed of (e.g.,) silicon nitride. After the second sub-spacer 325 is formed, the upper surface of the buffer pattern 305 may be exposed.

Figure 10A:
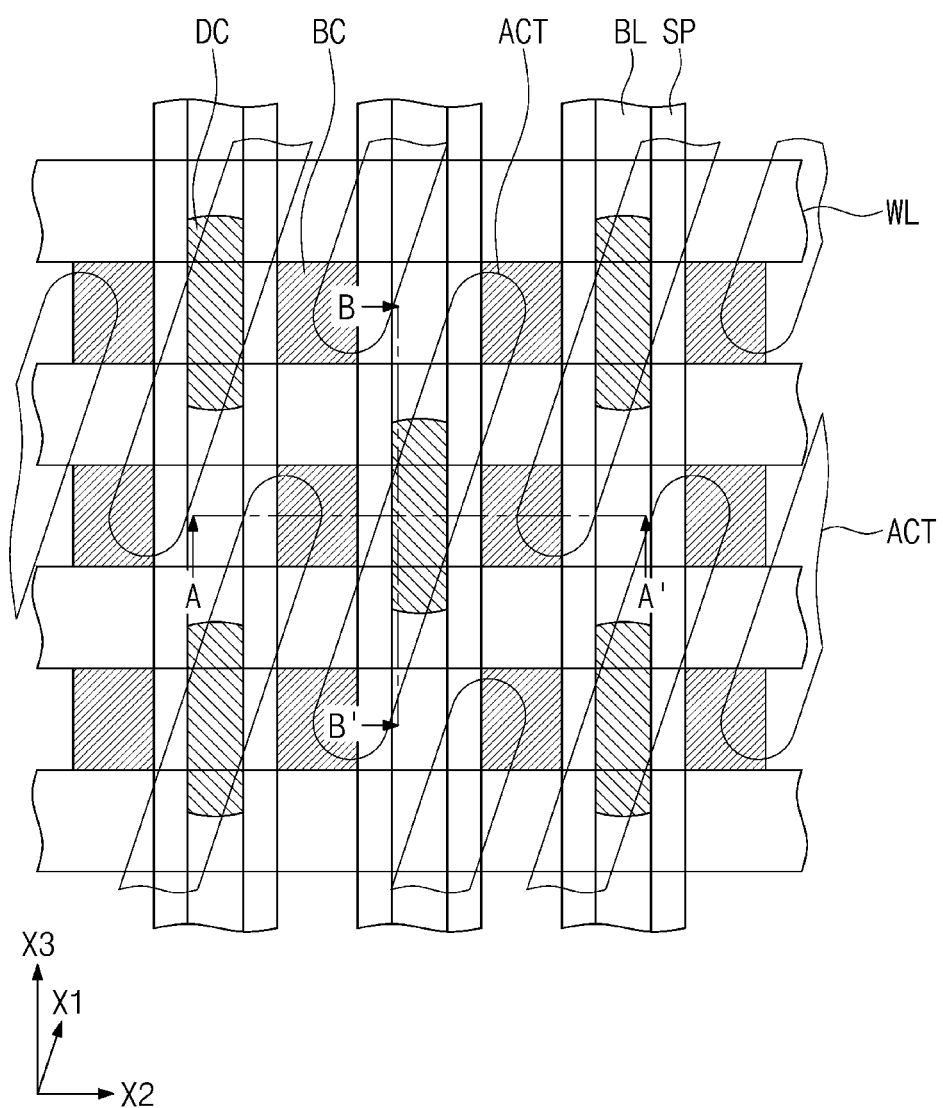
Figure 10B:
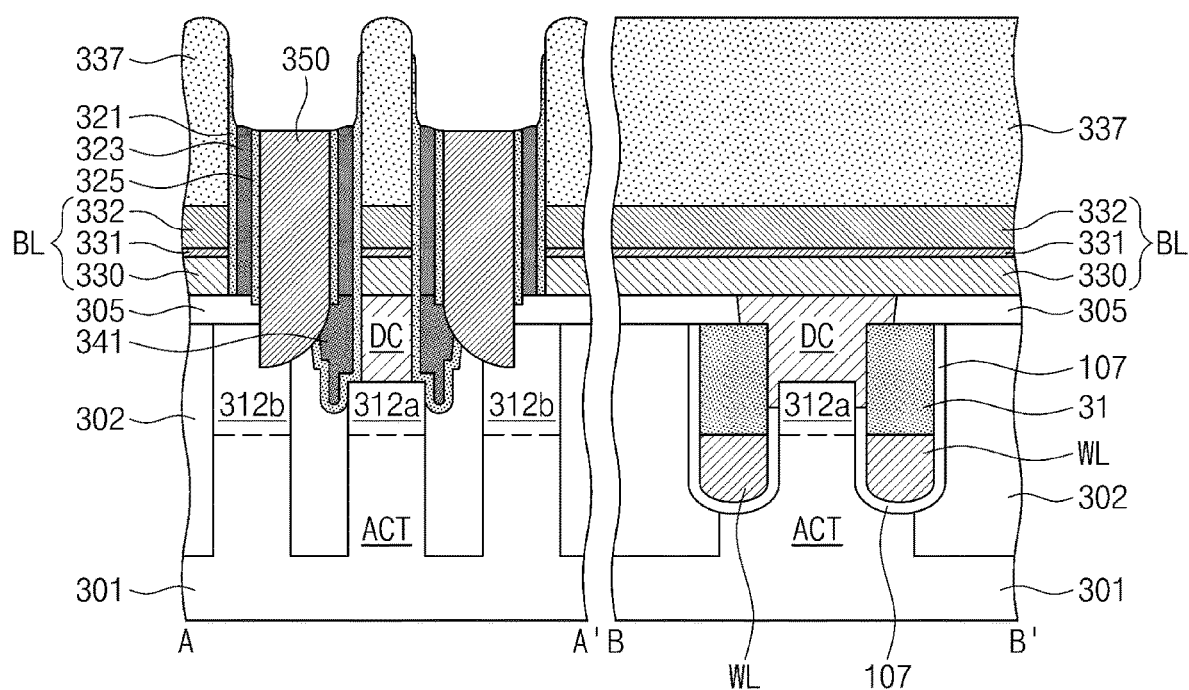

Referring to FIGS. 10A and 10B, a polysilicon layer may be formed on the entire surface of the substrate 301 so as to fill a space between the bit lines BL, and then the polysilicon layer may be etched to form a preliminary storage node contact 350 and to expose an upper sidewall of each of the first sub-spacer 321, the sacrificial spacer 323, and the second sub-spacer 325. Upper parts of the sacrificial spacer 323 and the second sub-spacer 325 may be removed to cause the sacrificial spacer 323 and the second sub-spacer 325 to have their upper ends with height(s) (or level(s)) similar to that of the upper surface of the preliminary storage node contact 350. Therefore, an upper sidewall of the first sub-spacer 321 may be exposed. This process may provide a large process margin for forming landing pads LP which will be discussed below. When the upper parts of the sacrificial spacer 323 and the second sub-spacer 325 are removed, an upper part of the first sub-spacer 321 may also be partially removed such that the first sub-spacer 321 may have a reduced width.

Figure 10C:
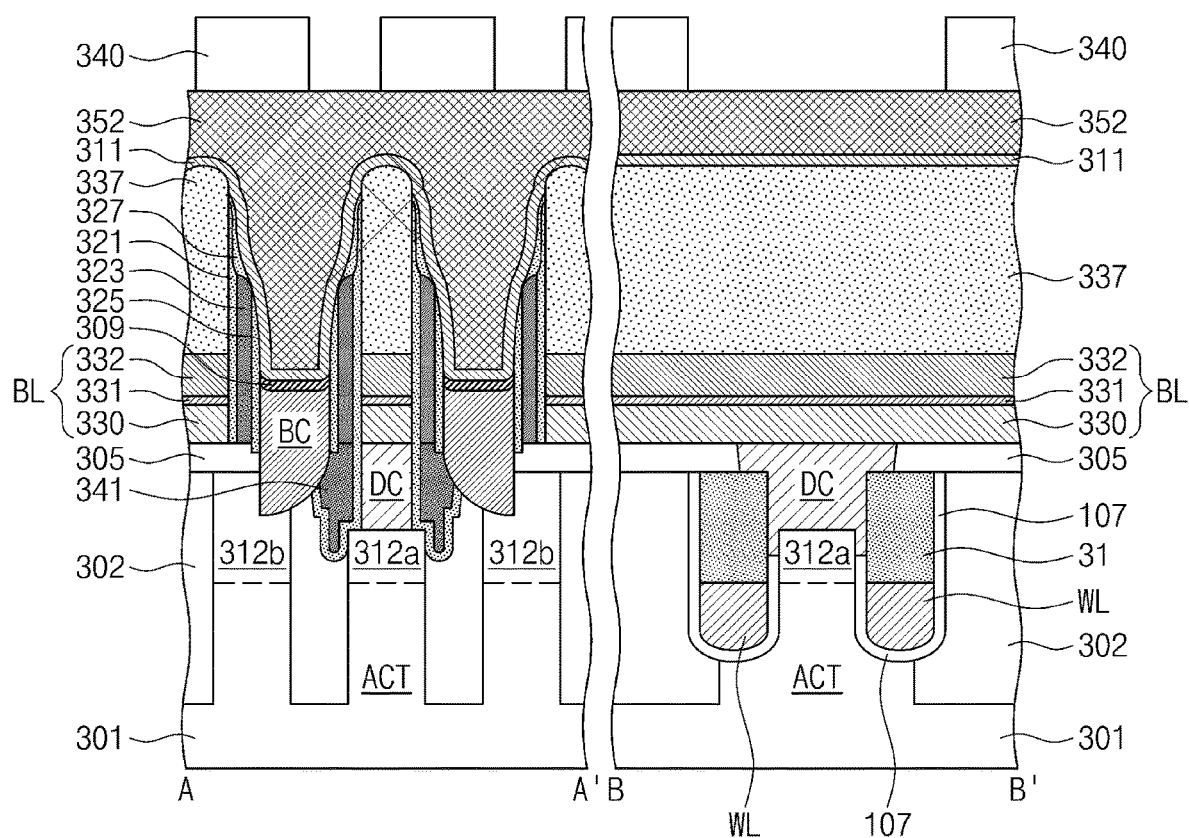

Referring to FIGS. 10A and 10C, a third sub-spacer layer may be conformally formed on the entire surface of the substrate 301, and then the third sub-spacer layer may be anisotropically etched to form a third sub-spacer 327 that covers the exposed upper sidewall of the first sub-spacer 321. The third sub-spacer 327 may have a lower part that covers an exposed upper end of the sacrificial spacer 323. The preliminary storage node contact 350 may be etched to expose an upper sidewall of the second sub-spacer 325 and simultaneously to form a storage node contact BC. The third sub-spacer 327 may complement a damaged upper part of the first sub-spacer 321 and may cover the sacrificial spacer 323, thereby serving to prevent the bit line BL from being attacked by an etchant used for etching the storage node contact BC and/or by a cleaning solution used in a subsequent cleaning process. As a result, damage to the bit line BL may be prevented. A cleaning process may be performed to clean an upper surface of the storage node contact BC. The upper surface of the storage node contact BC may undergo a metal silicidation process to form a storage node ohmic layer 309. A diffusion supper layer 311 may be conformally formed on the entire surface of the substrate 301. A landing pad layer 352 may be formed on the entire surface of the substrate 301, and may fill a space between the bit-line capping patterns 337. The landing pad layer 352 may include, for example, tungsten. Second mask patterns 340 may be formed on the landing pad layer 352. The second mask patterns 340 may define positions of landing pads LP which will be discussed below. The second mask patterns 340 may be formed to vertically overlap the storage node contacts BC. The second mask patterns 340 may be formed to have island shapes spaced apart from each other.

Figure 11:
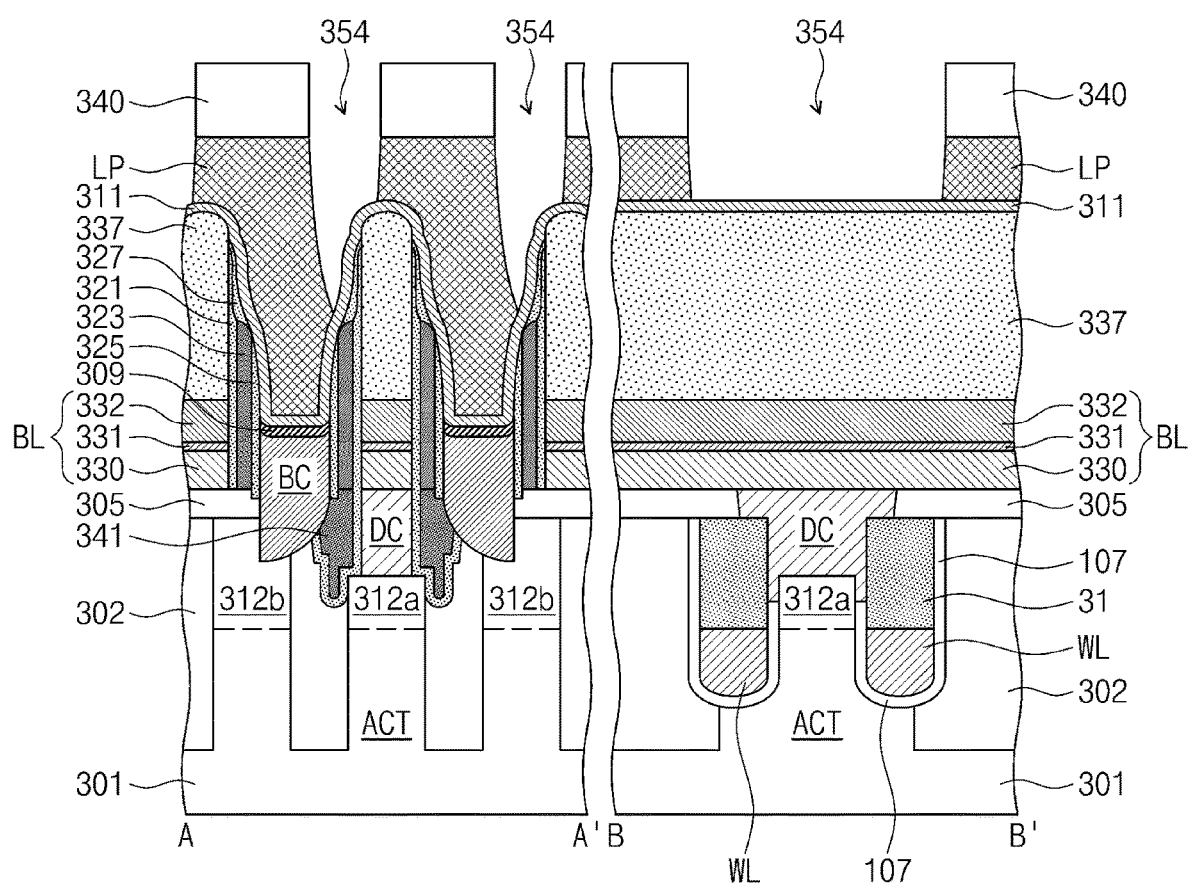

Referring to the embodiments illustrated in FIGS. 1A and 11, an anisotropic etching process may be performed, such that the second mask patterns 340 may be used as an etching mask to partially remove the landing pad layer 352 to form landing pads LP and simultaneously to form openings 354 that expose the diffusion supper layer 311. Afterwards, an isotropic etching process may be performed such that the diffusion supper layer 311 exposed to the openings 354 may be removed to form diffusion supper patterns 311a separated from each other and simultaneously to expose the third sub-spacers 327 and portions of upper surfaces of the bit-line capping patterns 337. Depending on the degree of progress of the isotropic etching process, the diffusion supper patterns 311a may be over-etched to partially expose lower surfaces of the landing pads LP.

Figure 12:
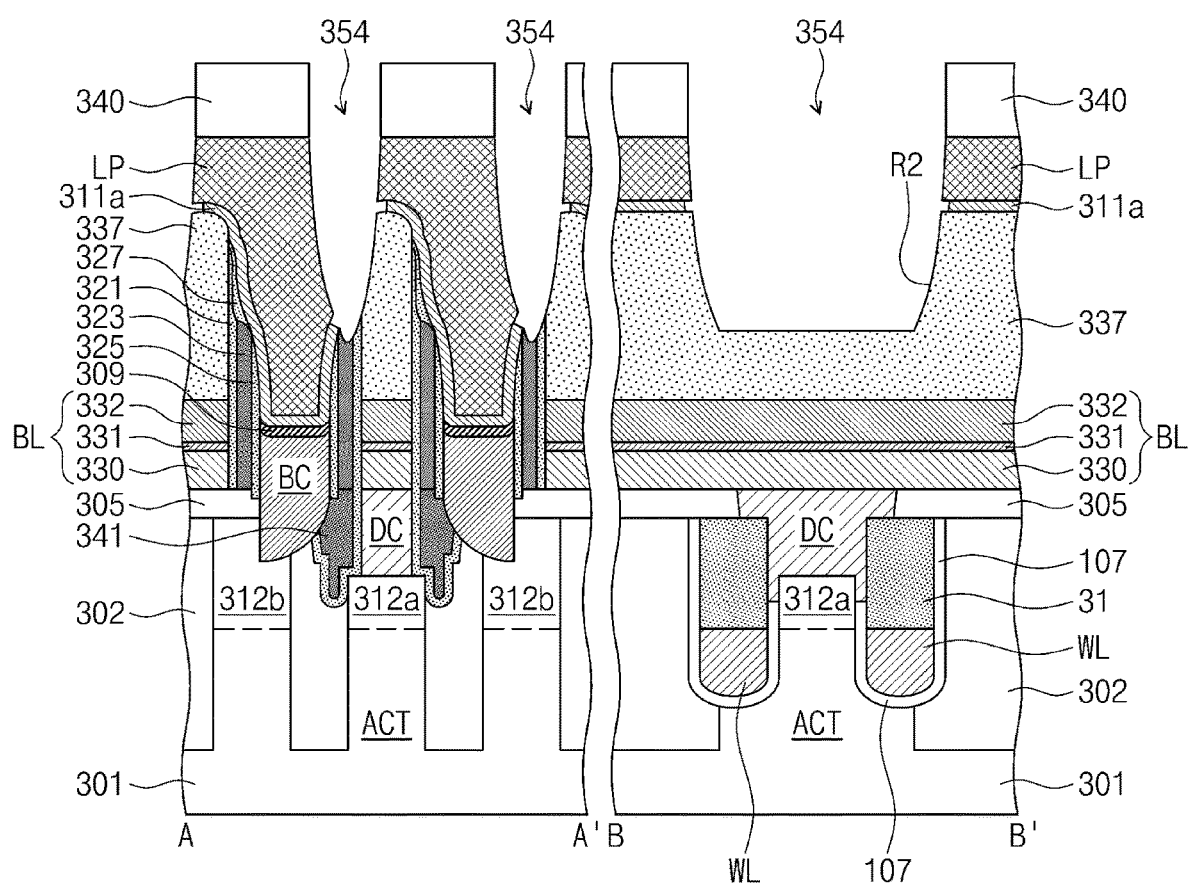

Referring to FIGS. 1A and 12, an anisotropic etching process may be performed in which the third sub-spacers 327 and portions of the bit-line capping patterns 337 exposed to the openings 354 are removed to expose the sacrificial spacer 323. In this case, a second recess R2 may be formed on the bit-line capping pattern 337.

Figure 13:
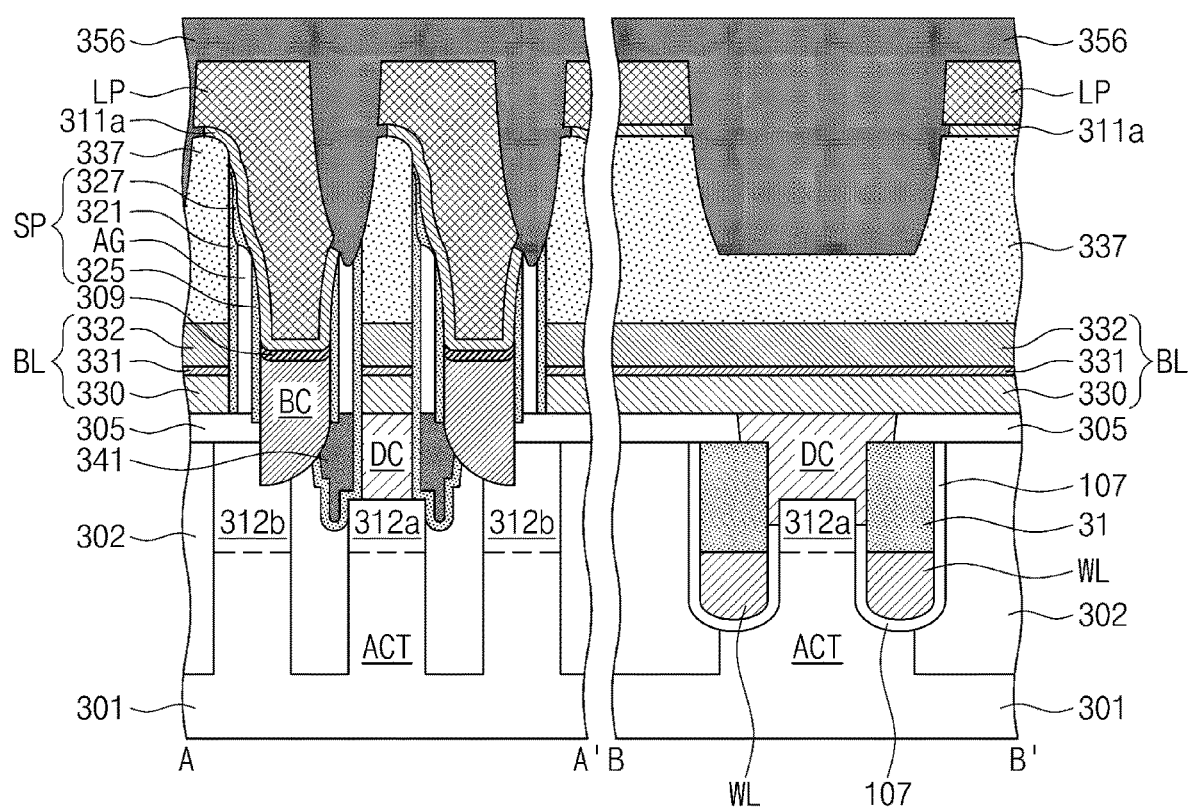

Referring to FIGS. 1A and 13, the sacrificial spacer 323 may be removed to form an air gap AG between the first sub-spacer 321 and the second sub-spacer 325. Thereafter, a thermal decomposition layer 356 may be formed to fill the openings 354 and the second recesses R2. The thermal decomposition layer 356 may also be formed on the landing pads LP. The thermal decomposition layer 356 may close an upper part of the air gap AG.

Figure 14:
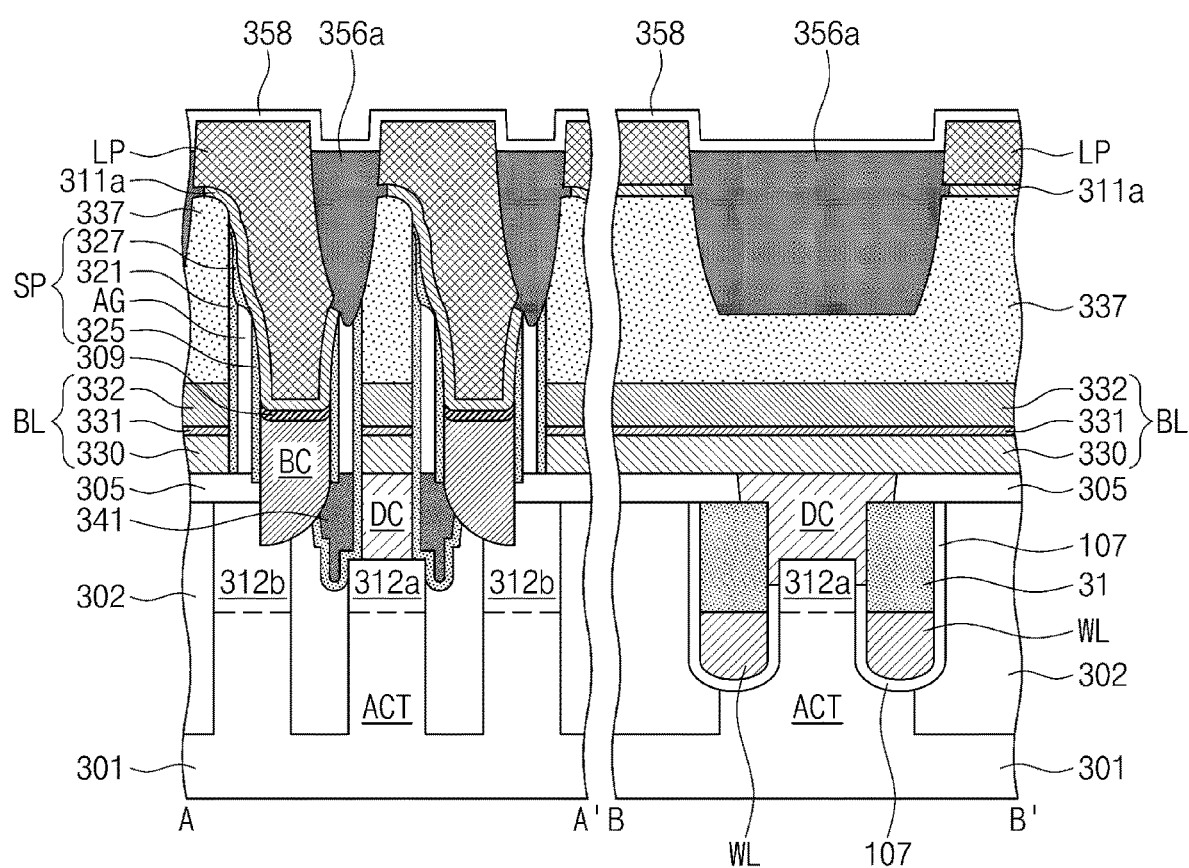

Referring to FIGS. 1A and 14, a first annealing process may be performed, such that an upper part of the thermal decomposition layer 356 may be thermally decomposed and removed. The partial removal of the thermal decomposition layer 356 may expose upper surfaces and upper sidewalls of the landing pads LP and may form thermal decomposition patterns 356a spaced apart from each other. A first capping layer 358 may be conformally formed on the thermal decomposition patterns 356a and the landing pads LP.

Referring to FIGS. 1A and 1B, a second annealing process may be performed such that the thermal decomposition patterns 356a and the sacrificial spacers 323 may all be removed to form gap regions GP. A second capping layer (not shown) may be formed on the first capping layer 358. An etch-back or chemical mechanical polishing (CMP) process may be subsequently performed to remove the first capping layer 358 and the second capping layer (not shown) on the landing pads LP and to expose the landing pads LP. A data storage pattern DS may be formed which contacts the landing pad LP.

Figure 15A:
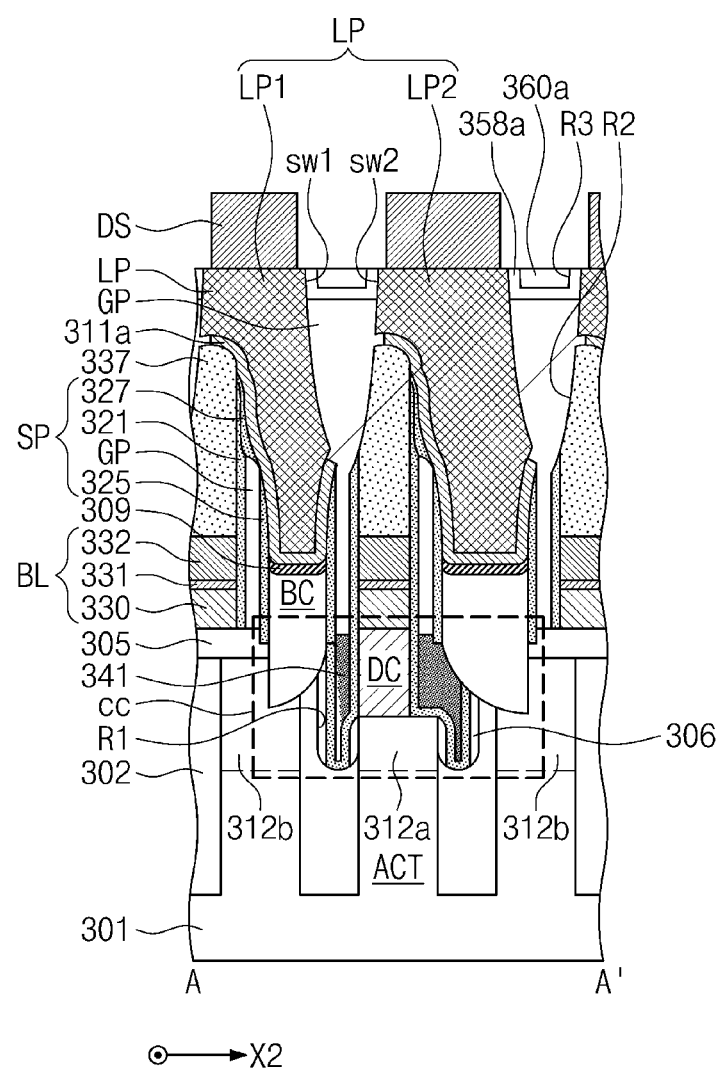
FIG. 15A is a cross-sectional view taken along line A-A' of FIG. 1A.
Figure 15B:
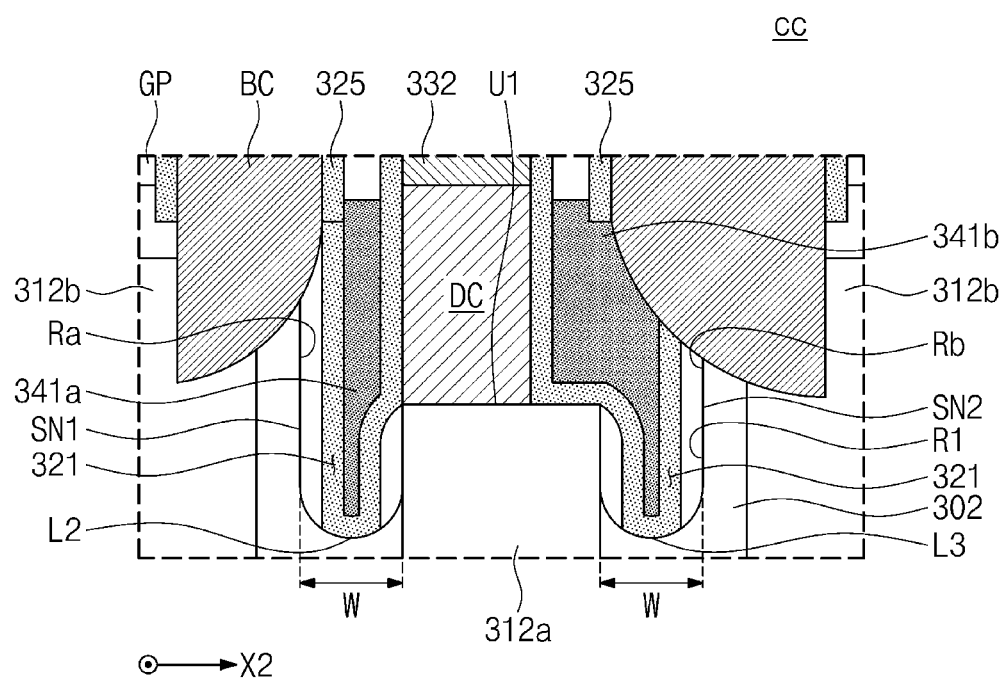
FIG. 15B is an enlarged, cross-sectional view illustrating section 'cc' of FIG. 15A.

FIG. 15A is a cross-sectional view taken along line A-A' of FIG. 1A and illustrating a semiconductor memory device according to embodiments of the inventive concept. FIG. 15A shows a case in which neither the first recess R1, nor the bit-line contact DC is exactly aligned with the first impurity region 312a. FIG. 15B is an enlarged cross-sectional view further illustrating the section 'cc' of FIG. 15A.

Referring to FIGS. 15A and 15B, the first recess R1 is displaced in the second direction X2 away from the first impurity region 312a. In contrast, the bit-line contact DC may be displaced in the second direction X2 towards the first impurity region 312a. The first recess R1 may have a first inner sidewall SN1 and an opposing second inner sidewall SN2. The first inner sidewall SN1 may be relatively closer to the bit-line contact DC, and the second inner sidewall SN2 may be relatively farther from the bit-line contact DC. The first inner sidewall SN1 may correspond to a sidewall of the device isolation pattern 302 that is relatively less etched, and the second inner sidewall SN2 may correspond to a sidewall of the device isolation pattern 302 that is relatively more etched.

A lower part of the first inner sidewall SN1 and a lower part of the second inner sidewall SN2 may be symmetrically disposed with respect to the first impurity region 312a. In addition, the lower part of the first inner sidewall SN1 and the lower part of the second inner sidewall SN2 may be spaced apart at the same interval W from the first impurity region 312a.

The bit-line contact DC may divide the first recess R1 into a first compartment Ra having a relatively larger space and a second compartment Rb having a relatively smaller space. The first compartment Ra of the first recess R1 may have a lower surface whose lowermost portion L2 is located at a lower level than that of the upper surface U1 of the first impurity region 312a, and likewise the second compartment Rb of the first recess R1 may have a lower surface whose lowermost portion L3 is located at a lower level than that of the upper surface U1 of the first impurity region 312a.

The first compartment Ra of the first recess R1 may be filled with a first lower buried dielectric pattern 341a whose upper width is less than that of a second lower buried dielectric pattern 341b that fills the second compartment Rb of the first recess R1.

Each of the first and second lower buried dielectric patterns 341a and 341b may include a lower part whose width is constant and an upper part whose width is variable. The lower part of the first lower buried dielectric pattern 341a and the lower part of the second lower buried dielectric pattern 341b may be symmetrically disposed with respect to the first impurity region 312a. The first sub-spacer 321, which covers the first inner sidewall SN1 of the first recess R1, may have an upper surface in contact with a lower surface of the second sub-spacer 325. Other configurations may be similar to those previously described with respect to FIGS. 1A, 1B and 1C.

FIGS. 16A, 16B, 16C, 16D, 16E, 16F, 16G and 16H are related cross-sectional views illustrating in one example a method of fabricating a semiconductor memory device according to embodiments of the inventive concept.

Figure 16A:
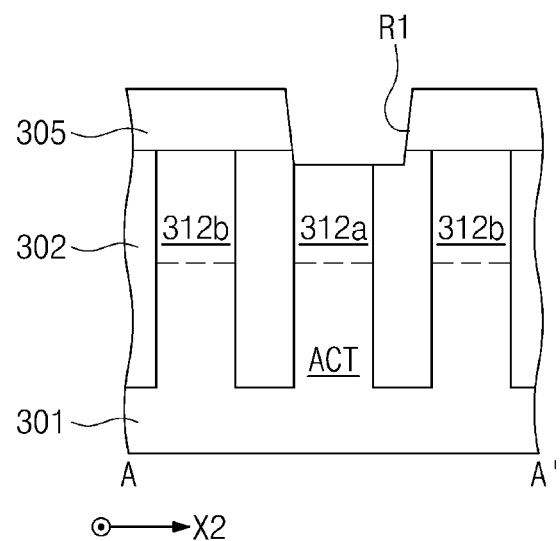
FIGS. 16A, 16B, 16C, 16D, 16E, 16F, 16G and 16H are related cross-sectional views illustrating in one example a method of fabricating a semiconductor memory device according to embodiments of the inventive concept.

Referring to FIGS. 2C and 16A, a separate etching mask (not shown) may be used to anisotropically etch the buffer layer 305a to form a buffer pattern 305 including a first recess R1 that exposes the first impurity region 312a. The first recess R1 may be displaced in the second direction X2 away from the first impurity region 312a.

This displacement may correspond to misalignment between the first impurity region 312a and an opening of the etching mask (not shown), and the opening of the etching mask may have a size that is a sum of a width of the first impurity region 312a and an additional width provided for misalignment. Even when misalignment occurs, an upper surface of the first impurity region 312a may be exposed.

Figure 16B:
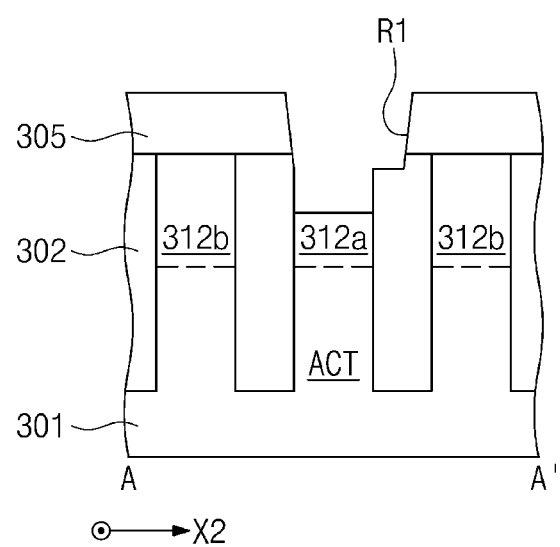

Referring to FIG. 16B, the first impurity region 312a exposed by the buffer pattern 305 may be selectively etched. The first recess R1 may thus have an increased depth, which may result in an expansion of the first recess R1.

Afterwards, the etching mask (not shown) is removed. In some embodiments, the etching mask may be removed before the first impurity region 312a is selectively etched.

Figure 16C:
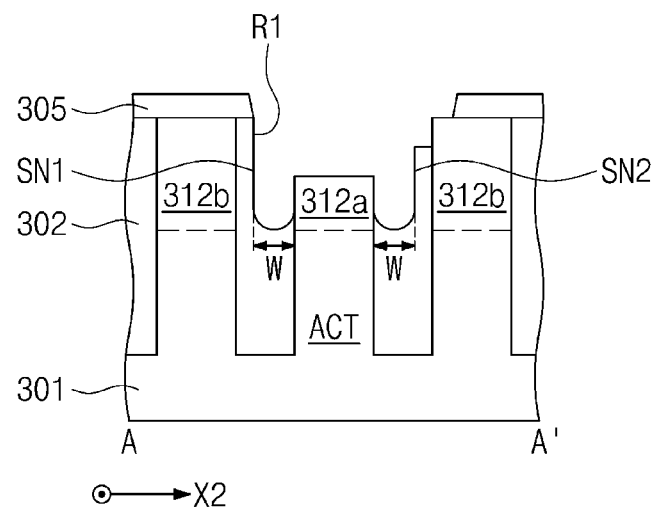

Referring to FIG. 16C, an isotropic etching process may be performed to expand the first recess R1. The isotropic etching process may etch an exposed sidewall of each of the buffer pattern 305 and the device isolation pattern 302. As the buffer pattern 305 and the device isolation pattern 302 include the same material(s), the buffer pattern 305 and the device isolation pattern 302 may be similarly etched.

The expansion of the first recess R1 may allow the first and second inner sidewalls SN1 and SN2 to have their lower parts that are symmetrically disposed with respect to the first impurity region 312a and that have the same interval W from the first impurity region 312a. The first impurity region 312a may have a fin-type shape having an exposed upper surface and partially exposed sidewall. A sidewall and/or an upper surface of a neighboring second impurity region 312b may be exposed in the isotropic etching process. In some embodiments, the sidewall and/or the upper surface of the neighboring second impurity region 312b may not be exposed.

Figure 16D:
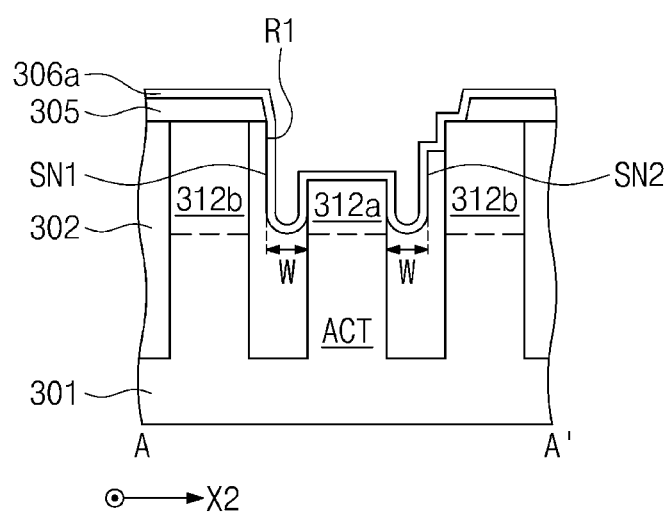

Referring to FIG. 16D, a line-shaped oxide layer 306a may be formed. The oxide layer 306a may include the same material as that of the buffer pattern 305 and the device isolation pattern 302. The oxide layer 306a may be, for example, a silicon oxide layer. The oxide layer 306a may be formed on exposed upper surface and sidewall of the buffer pattern 305, exposed upper surface and sidewall of the device isolation pattern 302, exposed upper surface and sidewall of the first impurity region 312a, and exposed upper surface and/or sidewall of the second impurity region 312b.

Figure 16E:
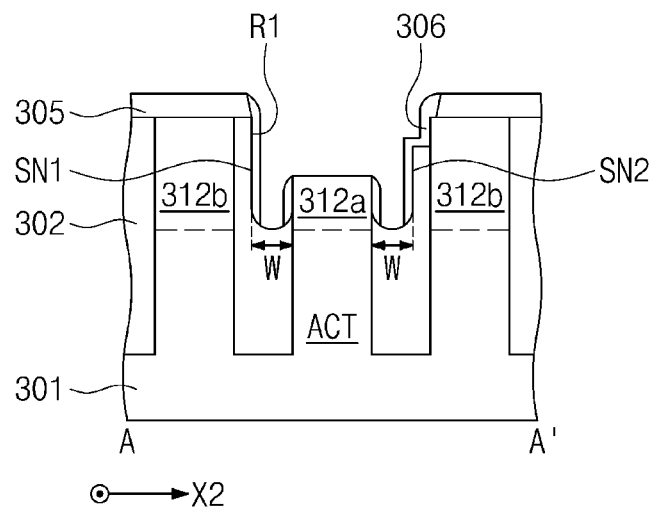

Referring to FIG. 16E, the oxide layer 306a may be etched to form an oxide spacer 306. For example, an anisotropic etching process may etch the oxide layer 306a. The anisotropic etching process may re-expose the upper surface of the first impurity region 312a and the lower surface of the first recess R1. The oxide spacer 306 may re-cover the sidewall of the first recess R1 and the exposed portion of the second impurity region 312b.

As the oxide spacer 306 protects the second impurity region 312b that has been exposed as a result of the isotropic etching process of FIG. 16C, the second impurity region 312b may not allowed to contact the etchant during a subsequent etching process. For example, additional etching of the second impurity region 312b may be prevented during the formation of a bit line BL as described hereafter. When the oxide spacer 306 is not formed, the exposed second impurity region 312b may be etched to induce a contact failure between the second impurity region 312b and the storage node contact (see. e.g., the element 'BC' of FIG. 15A). According to embodiments of the inventive concept, such contact failures may be prevented.

The formation of the oxide spacer 306 may also be applicable to the case where the second impurity region 312b is exposed due to the isotropic etching process discussed in FIGS. 4A, 4B, 5A, and 5B.

Figure 16F:
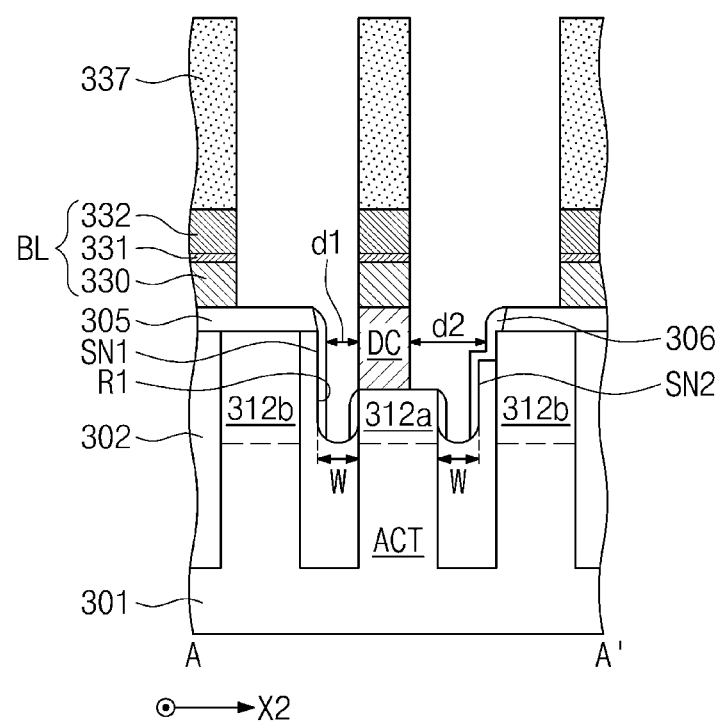

Referring to FIG. 16F, a bit line BL, a bit-line contact DC, and a bit-line capping pattern 337 may be formed on the substrate 301. The bit line BL, the bit-line contact DC, and the bit-line capping pattern 337 may be formed by an etching process in which the first mask pattern 339 of FIG. 7B is used as an etching mask. As an example where an etching process is performed in a state that the first mask pattern 339 is misaligned with the first impurity region 312a, the bit-line contact DC may be formed closer to the first inner sidewall SN1 than to the second inner sidewall SN2. A first width d1 between the bit-line contact DC and the first inner sidewall SN1 of the first recess R1 may be less than a second width d2 between the bit-line contact DC and the second inner sidewall SN2 of the first recess R1.

According to embodiments of the inventive concept, because an isotropic etching process of the device isolation pattern 302 is performed around the first impurity region 312a, it may be possible to enlarge a space into which an etchant may be introduced.

A lower part of the first inner sidewall SN1 and a lower part of the second inner sidewall SN2 may be spaced apart at the same interval W from the first impurity region 312a. Therefore, even when the first recess R1 is formed to have displacement in one direction away from the first impurity region 312a, and even when the bit line BL is formed to have displacement in other direction away from the first impurity region 312a, a space into which an etchant is introduced may be uniformly and sufficiently provided in the first recess R1. As a result, even if misalignment occurs, a conductive layer (e.g., a polysilicon layer) may be prevented from being insufficiently etched when the bit-line contact DC is formed, with the result that process defects may decrease.

Figure 16G:
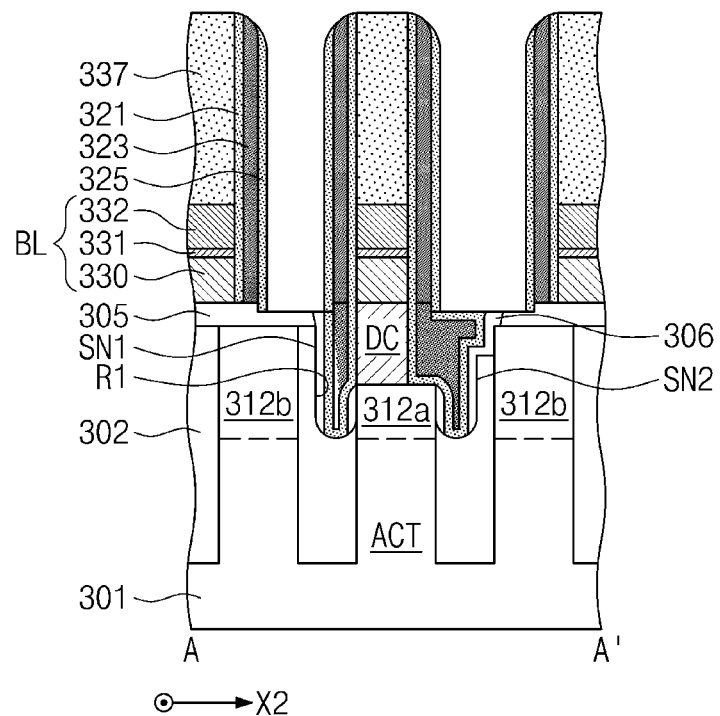

Referring to FIG. 16G, a first sub-spacer 321 and a lower buried dielectric pattern 341 may be formed. Afterwards, a second sub-spacer 325 and a sacrificial spacer 323 may be formed.

Figure 16H:
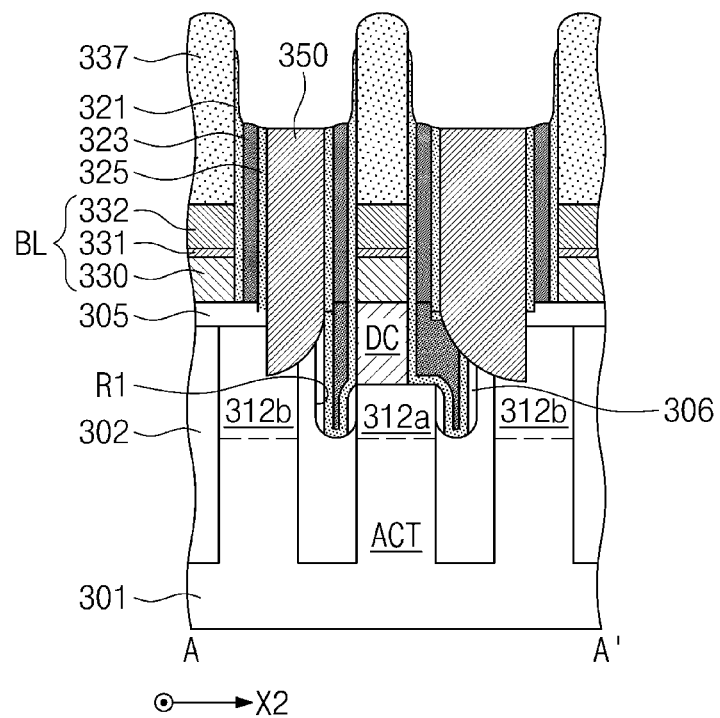

Referring to FIG. 16H, a preliminary storage node contact 350 may be formed. In some embodiments, preliminary storage node contacts 350 having different sizes may be formed across the bit-line contact DC.

Thereafter, the processes previously described with respect to FIGS. 10C, 11, 12, 13, and 14 may be performed in order to complete the fabrication of a semiconductor memory device as illustrated in FIG. 15A.

For semiconductor memory devices and their fabrication methods according to embodiments of the inventive concept, a recess may be provided to have its facing inner sidewalls that are spaced apart at the same interval from an impurity region on which a bit-line contact is formed. According to embodiments of the inventive concept, even in a case where misalignment occurs in forming the recess and/or a bit line, a space into which an etchant is introduced may be securely obtained around the impurity region during and/or after the formation of the bit-line contact. Therefore, a conductive layer (e.g., polysilicon) may be prevented from being insufficiently etched in forming the bit-line contact, and accordingly when a storage node contact is subsequently formed, it may be possible to prevent process defects such as short-circuit between the bit-line contact and the storage node contact. Thus, a semiconductor memory device according to the inventive concept may have improved reliability.

The aforementioned description is drawn to certain embodiments of the inventive concept. However, the inventive concept is not limited to only the embodiments described above. Those skill in the art will recognize that various modifications may be made to the foregoing without departing from the spirit and scope of the following claims.

What is claimed is:

1. A semiconductor memory device comprising:
a first impurity region and a second impurity region spaced apart in a substrate;
a device isolation pattern between the first impurity region and the second impurity region;
a bit-line contact on the first impurity region;
a storage node contact on the second impurity region;
a dielectric pattern between the bit-line contact and the storage node contact; and
a spacer between the dielectric pattern and the device isolation pattern, wherein:
a lowermost surface of the spacer is below an upper surface of the first impurity region, and
an upper part of a sidewall of the device isolation pattern has a first slope and, a lower part of the sidewall of the device isolation pattern has a second slope different from the first slope.

2. The semiconductor memory device of claim 1, wherein the second slope is less acute than the first slope.

3. The semiconductor memory device of claim 1, wherein:
the sidewall of the device isolation pattern includes an inflection point at which a slope of the sidewall changes from the first slope to the second slope, and
the inflection point is disposed above an upper surface of the first impurity region.

4. The semiconductor memory device of claim 1, wherein a sidewall of the dielectric pattern has a shape transferred from the sidewall of the device isolation pattern.

5. The semiconductor memory device of claim 1, further comprising a single layer buffer pattern on the substrate.

6. The semiconductor memory device of claim 5, wherein the buffer pattern and the device isolation pattern include a same material.

7. The semiconductor memory device of claim 6, wherein the buffer pattern includes a silicon oxide layer and the buffer pattern excludes a silicon nitride layer.

8. The semiconductor memory device of claim 1, wherein:
the second impurity region is provided as a pair of second impurity regions and the pair of second impurity regions are provided across the first impurity region,
dielectric patterns are respectively disposed between the first impurity region and the pair of second impurity regions and have a lower surface below an upper surface of the first impurity region, and
widths of the dielectric patterns are the same at a level of the upper surface of the first impurity region.

9. The semiconductor memory device of claim 8, wherein the widths of the dielectric patterns change at a level above the upper surface of the first impurity region and vary one dielectric pattern from another dielectric pattern among the dielectric patterns.

10. The semiconductor memory device of claim 1, wherein the device isolation pattern includes a sidewall having a step difference.

11. A semiconductor memory device comprising:
a substrate including a first impurity region spaced apart from a second impurity region;
a device isolation pattern disposed between the first impurity region and the second impurity region;
a bit-line contact on the first impurity region;
a storage node contact on the second impurity region;
a dielectric pattern disposed between the bit-line contact and the storage node contact; and
a spacer between the dielectric pattern and the device isolation pattern, wherein:
a lowermost surface of the spacer is below an upper surface of the first impurity region, and
the dielectric pattern includes lower parts, each having a constant width, and upper parts, each having a variable width.

12. The semiconductor memory device of claim 11, wherein a lower surface of the dielectric pattern is below an upper surface of the first impurity region.

13. The semiconductor memory device of claim 11, further comprising:
a buffer pattern disposed on the substrate, wherein
the buffer pattern includes a material different than that of the dielectric pattern.

14. The semiconductor memory device of claim 11, wherein:
the second impurity region is provided as a pair of second impurity regions and the pair of second impurity regions is provided across from the first impurity region, and
the lower parts of the dielectric pattern between the first impurity region and the pair of second impurity regions are symmetrically disposed with respect to the first impurity region.

15. A semiconductor memory device comprising:
a first impurity region in a substrate;
a pair of second impurity regions in the substrate spaced apart from each other and across from the first impurity region;
device isolation patterns respectively between the first impurity region and the pair of second impurity regions;
a bit-line contact on the first impurity region;
storage node contacts respectively on the pair of second impurity regions;

dielectric patterns respectively between the bit-line contact and the storage node contacts; and a spacer between the dielectric pattern and the device isolation pattern, wherein:

a lowermost surface of the spacer is below an upper surface of the first impurity region, sidewalls and upper surfaces of the device isolation patterns define a recess having a first inner sidewall and an opposing second inner sidewall, the first inner sidewall includes an upper part, a lower part and a first inflection point disposed above an upper surface of the first impurity region at which a slope of the first inner sidewall changes, and the second inner sidewall includes an upper part, a lower part and a second inflection point disposed above an upper surface of the first impurity region at which a slope of the second inner sidewall changes.

16. The semiconductor memory device of claim 15, wherein the lower part of the first inner sidewall and the lower part of the second inner sidewall are spaced apart by a same interval from the first impurity region.

17. The semiconductor memory device of claim 16, wherein the lower part of the first inner sidewall and the lower part of the second inner sidewall have the same slope.

18. The semiconductor memory device of claim 16, wherein at a same level, an interval between the bit-line contact and the first inner sidewall is different from an interval between the bit-line contact and the second inner sidewall.

19. The semiconductor memory device of claim 16, wherein at least one of the first inner sidewall and the second inner sidewall has a step difference.

* * * * *